United States Patent [19]
Matsuo et al.

[11] Patent Number: 5,909,266
[45] Date of Patent: Jun. 1, 1999

[54] PROCESS AND APPARATUS FOR PRODUCING ELECTRODE PLATE AND PROCESS FOR PRODUCING LIQUID CRYSTAL DEVICE INCLUDING THE PLATE

[75] Inventors: Yuji Matsuo, Machida; Masaru Kamio, Sagamihara; Hiroyuki Tokunaga, Fujisawa; Haruo Tomono, Machida, all of Japan

[73] Assignee: Canon Kabushiki Kaisha, Tokyo, Japan

[21] Appl. No.: 08/924,920

[22] Filed: Sep. 8, 1997

[30] Foreign Application Priority Data

Sep. 11, 1996 [JP] Japan ................................. 8-240826
Sep. 12, 1996 [JP] Japan ................................. 8-242171

[51] Int. Cl.$^6$ ........................... G02F 1/13; G02F 1/1333
[52] U.S. Cl. ......................... 349/187; 349/122; 349/158
[58] Field of Search ................................ 349/187, 122, 349/147, 158, 190

[56] References Cited

U.S. PATENT DOCUMENTS

| | | | |
|---|---|---|---|
| 4,744,637 | 5/1988 | Sekimura et al. | 350/339 R |
| 4,802,743 | 2/1989 | Takao et al. | 350/339 F |
| 4,818,075 | 4/1989 | Takao et al. | 350/339 F |
| 5,078,475 | 1/1992 | Sekimura et al. | 359/68 |
| 5,398,126 | 3/1995 | Takao et al. | 359/68 |
| 5,717,475 | 2/1998 | Kamio et al. | 349/147 |
| 5,838,409 | 11/1998 | Tomono et al. | 349/122 |

FOREIGN PATENT DOCUMENTS 02063019  3/1990  Japan .
06347810 12/1994  Japan .

*Primary Examiner*—William L. Sikes
*Assistant Examiner*—Tarifur R. Chowdhury
*Attorney, Agent, or Firm*—Fitzpatrick, Cella, Harper & Scinto

[57] ABSTRACT

An electrode plate including a substrate, a plurality of stripe-shaped electrodes with gaps therebetween, and a flattening layer filling the gaps is produced through a process including the steps of: supplying a flowable polymeric material to a part of a surface of a smooth plate or substrate; applying the smooth plate and the substrate to each other so as to sandwich the polymeric material therebetween to provide a laminate; pressing the smooth plate and the substrate to each other, the pressing step including a preliminary pressure step wherein a pressed portion is moved from a first side of the laminate to a second side parallel to the first side under application of a first pressure and a main pressure step wherein a pressed portion is moved from one side of the laminate to the other side parallel to the one side under application of a second pressure larger than the first pressure to extend the polymeric material over at least a region including the stripe-shaped electrodes; curing the polymeric material by irradiation with a light to form a flattening layer; and removing the smooth plate from the laminate.

46 Claims, 19 Drawing Sheets

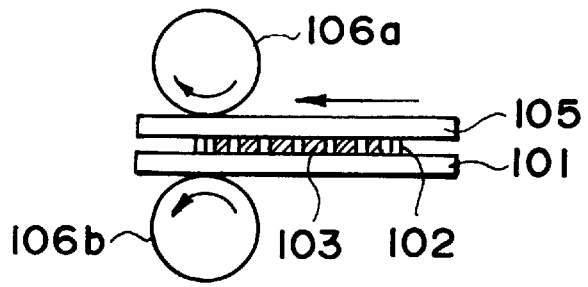
F I G. 4
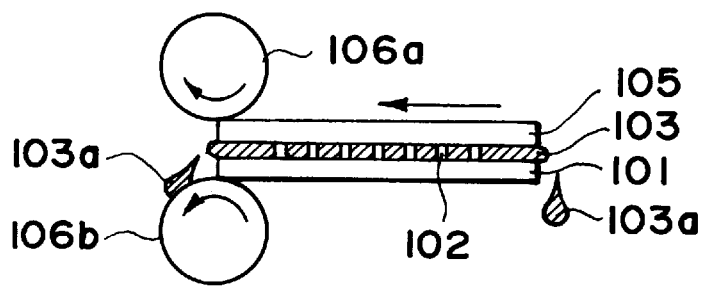
F I G. 5
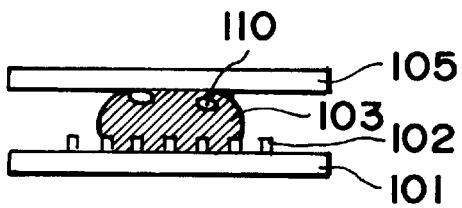
F I G. 6
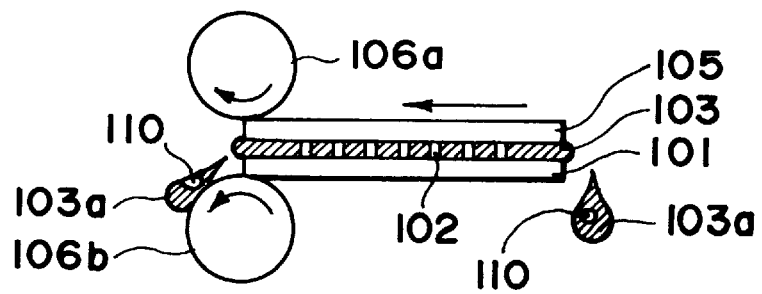
F I G. 7

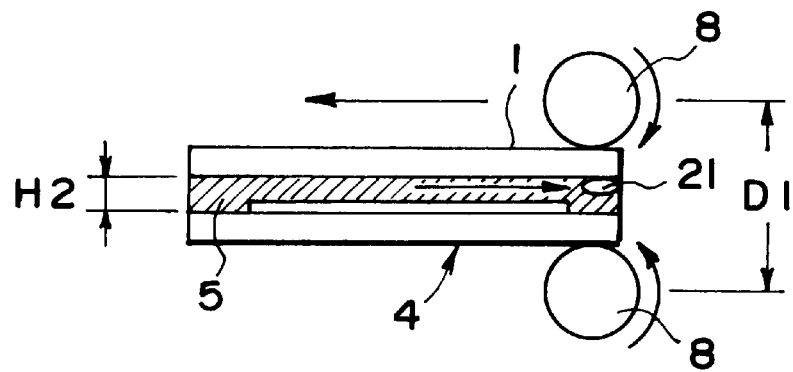
F I G. 17
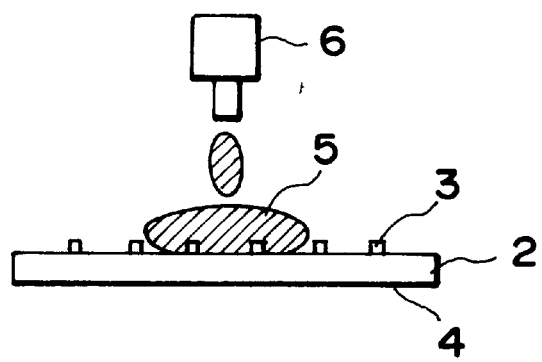
F I G. 18A
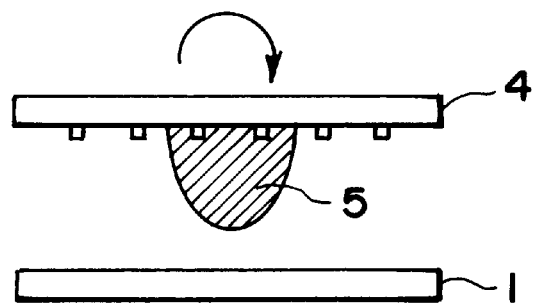
F I G. 18B

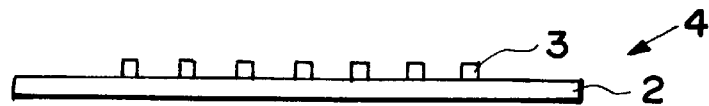
F I G. 19
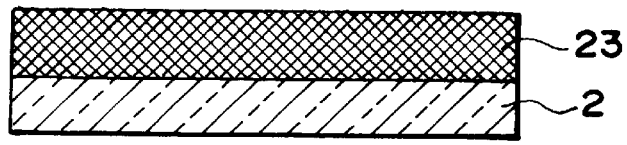
F I G. 20A
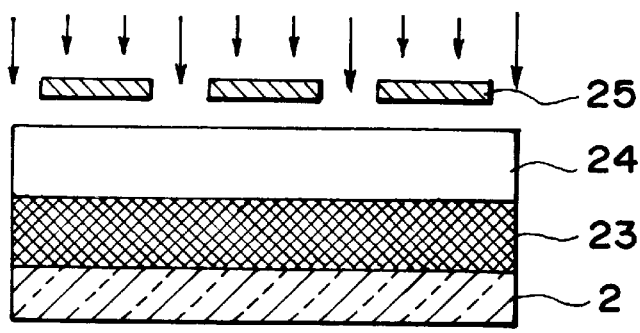
F I G. 20B
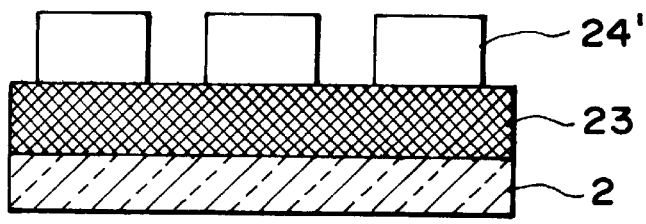
F I G. 20C
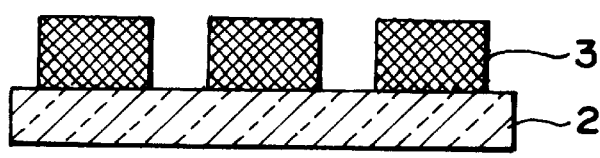
F I G. 20D

PROCESS AND APPARATUS FOR PRODUCING ELECTRODE PLATE AND PROCESS FOR PRODUCING LIQUID CRYSTAL DEVICE INCLUDING THE PLATE

FIELD OF THE INVENTION AND RELATED ART

The present invention relates to a process and apparatus for producing an electrode plate and a process for producing a liquid crystal device including the electrode plate, particularly without being adversely affected by air bubbles and flowing (running) out of flowable resin during an electrode plate production steps.

Electrode plates conventionally used in liquid crystal devices of, e.g., a twisted nematic (TN)-type and a super twisted nematic (STN)-type generally comprise a glass substrate and transparent electrodes of ITO (indium-tin-oxide), etc., formed thereon. However, such transparent electrodes have a fairly high resistivity, so that they have caused a problem of voltage waveform deformation due to electrical signal delay along with increases in size and resolution of the display area. This problem is particularly noticeable in the case of a liquid crystal device using a ferroelectric liquid crystal due to a smaller cell gap or thickness of a liquid crystal layer (e.g., ca. 1.0–2.0 $\mu$m).

In order to solve the problem, it may be possible to increase the thickness of the transparent electrodes, but the formation of such thick transparent electrodes requires increased time and cost and also leads to an inferior adhesiveness to the glass substrate.

In order to solve the above-mentioned problems, it has been practiced to form a low-resistance metal electrode along a transparent electrode of a small thickness in preparation of an electrode plate for a liquid crystal device (as disclosed in Japanese Laid-Open Patent Applications (JP-A) 2-63019 and 6-347810).

Such an electrode plate has a structure including a light-transmissive substrate provided with a plurality of electroconductive patterns constituting auxiliary electrodes with gaps therebetween filled flatly with a resinous (polymeric) material and also provided with a plurality of transparent electrodes constituting principal electrodes formed on a flat surface of the electroconductive patterns and the resinous material. In a production process of the electrode plate, a flowable resinous material (flowable resin) is placed between a smooth or smoothing mold substrate (hereinafter called "smooth plate") and a light-transmissive substrate having thereon electroconductive patterns with prescribed gaps therebetween and the smooth plate and the light-transmissive substrate are pressed substantially linearly to each other to ensure a contact of the smooth plate surface with the surface of the electroconductive patterns. Then, a linearly pressed portion is relatively moved from one side of a laminate including the smooth plate and the substrate to the other side thereof while maintaining the contact state between the smooth plate and the electroconductive patterns. As a result, the light-transmissive substrate and the smooth plate are caused to join to each other while spreading or extending the flowable resin over an entire region of the electroconductive patterns. Thereafter, the thus spread flowable resin is cured by irradiation with ultraviolet (UV) rays, followed by removal of the smooth plate from the laminate and formation of transparent electrodes on the flat surface of the electroconductive patterns and the cured resin to prepare an electrode plate.

A specific example of such a production process of the electrode plate will be explained hereinbelow with reference to FIGS. 1A–1G.

According to the process, as shown in FIG. 1A, on a smooth plate 1, a prescribed amount of a liquid resin of UV-curable resin 5 is placed dropwise by using, e.g., a dispenser 6. Then, as shown in FIGS. 1B and 1C, a glass substrate (as a light-transmissive substrate) 2 already provided with an electroconductive pattern of ca. 1 $\mu$m-thick metal electrodes 3 is placed thereon so that the surface thereof 4a provided with the metal electrodes 3 contacts the liquid resin 5.

Further, as shown in FIG. 1D, the smooth plate 1 and the substrate 4 (together constituting a laminate 45) are pressed to each other, e.g., by inserting the laminate 45 in a gap between a pair of rotating rollers 7 in a direction of an arrow (shown on the substrate 4) substantially perpendicular to a longitudinal direction of the metal electrodes 3, thus ensuring an intimate contact of the smooth plate 1 with the substrate 4 while extending the resin 5 over an entire metal electrode-forming region. This step, the pressing pressure is exerted on the laminate 45 so that the smooth plate 1 and the substrate 4 are caused to come in contact with each other firmly and uniformly over the entire area so as to substantially remove the UV-curable resin 5 from the metal electrode surface.

Thereafter, the substrate 4 in contact with the smooth plate 1 is irradiated with UV rays (shown by arrows) from the substrate side to cure the UV-curable resin 5, as shown in FIG. 1E. Then, as shown in FIG. 1F, the integral structure of the substrate 4 and the cured resin 5 is separated from the smooth plate 1 in a direction of an arrow. Finally, a plurality of transparent electrodes 15 of, e.g., an ITO film is formed on a flat surface formed by the metal electrodes 3 and the cured resin 5 to obtain an electrode plate 10, as shown in FIG. 1G.

In the above production process of the electrode plate 10, when the substrate 4 provided with the metal electrodes 3 is caused to contact the resin 5 placed on the smooth plate 1 as shown in FIG. 2B, an air bubble 21 is incorporated in the resin 5 as shown in FIG. 2B in some cases. The air bubble 21 is generally removed to the outside of the laminate 45 during the pressing step as shown in FIG. 1C since the resin is moved due to the rotation of the rollers 7.

FIGS. 3A–3H shows successive steps involved in another specific example of the production process of the electrode plate.

A prescribed amount of a flowable UV-curable resin 103 is placed dropwise on a surface of a glass substrate 101 provided with a plurality of ca. 1 $\mu$m-thick metal electrodes 102 at the surface by using a dispenser 104 (FIG. 3A). A smooth plate 105 having a light-transmissive smooth surface is superposed on the glass substrate 101 so as to sandwich the UV-curable resin 103 therebetween (FIGS. 3B and 3C). Then, a laminate including the smooth plate 105 and the glass substrate 101 between which the metal electrodes 102 and the UV-curable resin 103 are disposed is inserted in a gap between a pair of rotatable rollers 106a and 16b of a press in a direction of an arrow A substantially perpendicular to a longitudinal (extension) direction of the metal electrodes 102 to effect a pressing of the laminate, thus improving an adhesiveness (FIG. 3D). In this step, the resin 103 is removed from the surface of the metal electrodes 12 and the smooth plate 105 is firmly and uniformly joined to the entire surface of the glass substrate 101 via the resin 103 and the metal electrodes 102.

Thereafter, the laminate is taken out from the gap between the rollers 106a and 106b and the UV-curable resin 103 is cured by irradiating the resin with UV rays 107 issued from a region above the smooth plate 105 (FIG. 3E). Then, the smooth plate 105 is removed from the integral structure of the glass substrate 101 and the UV-cured resin 103 by using a peeling tool (not shown) to provide the integral structure with a flat (even) surface where the metal electrodes 102 are embedded with the UV-curable resin 103 (FIGS. 3F and 3G). Finally, a plurality of transparent electrodes 109 of, e.g., ITO films are formed on the flat surface so as to be each electrically connected with an associated metal electrode 102 (FIG. 3H).

In this step, similarly as in the step shown in FIG. 2B, an air bubble is incorporated within the UV-curable resin 103 in some cases but is generally removed by the pressing step shown in FIG. 3D since the rotation of the rollers 106a and 106b promotes the flow of the resin portion including the air bubble to discharge such a resin portion outside the laminate.

In the above-mentioned production processes of the electrode plate shown in FIGS. 1A–1G and 3A–3H, however, it has been difficult to precisely control a required amount of the UV-curable resin 5 (103) placed dropwise on the smooth plate 1 (FIG. 1A) or the substrate 101 having thereon the metal electrodes 102 (FIG. 3A) while maintaining a good reproducibility in the supplied resin amount.

This is attributable to a temperature-dependence of a viscosity of the UV-curable resin such that the viscosity varies depending on a charge in environmental temperature (e.g., a temperature of a production apparatus or an ambient temperature), thus resulting in a poor reproducibility in a dropping amount of the resin in some cases even if resin-supplying (dropping) conditions including a pressing force, a pressure time and a size of a nozzle with respect to, e.g., a dispenser of an air-pressure conveyance-type are fixed.

In the above circumstances, in the case where the amount of the UV-curable resin 5 to be placed dropwise is small in the process as shown in FIGS. 1 and 2, the flow of the resin 5 is liable to become insufficient. Further, in the case where the metal electrodes 3 is made to have a large thickness to hinder the flow of the resin 5, the air bubble is not readily removed outside the laminate 45, thus remaining within the gap between the metal electrodes 3 as shown in FIG. 2C.

In this state, when the laminate 45 is irradiated with UV light to cure the resin 5 as shown in FIG. 2D and the integral structure of the substrate 4 and the resin 5 is removed from the smooth plate 1 in a direction of an arrow 9 as shown in FIG. 2E, the resultant surface of the integral structure has an air bubble-containing portion where its surface largely caves in.

As a result, when the transparent electrodes 15 are formed on the surface of the integral structure, the caved portion is liable to cause a short-circuit of the transparent electrodes 15 and leads to a remarkably larger cell thickness thereat compared with those at other portions when a liquid crystal cell or device is prepared, thus resulting in serious defects such as an irregularity in alignment state of liquid crystal molecules.

In order to obviate the above difficulties, the amount of the resin 5 may be increased. In such a case, however, after the pressing step as shown in FIGS. 1D and 2C, an excessive resin portion flowing out from the gap between the substrate 4 and the smooth plate 1 adheres to the rollers 7 in some cases, thus requiring an additional removal (cleaning) step of the resin portion to lower a productivity.

On the other hand, in the process shown in FIGS. 3A–3H, if the resin amount is small, the air bubbles within the UV-curable resin 103 are not sufficiently discharged outside similarly as in the case of the process shown in FIGS. 1 and 2. Further, as shown in FIG. 4, the UV-curable resin 103 is not completely extended over the entire area of the gaps between the metal electrodes 102 to be filled therewith, particularly at an end portion of the gaps, when the laminate including the smooth plate 105 and the glass substrate 101 between which the resin 103 and the metal electrodes 102 are sandwiched is pressed by the rollers 106a and 106b in a direction of an arrow (shown on the smooth plate 105), thus failing to uniformly bury flat the metal electrodes 102 with the resin 103.

In the case where the resin amount is large, as shown in FIG. 5 when the laminate is pressed by the rollers 106a and 106b, an excessive resin portion 103a runs out from the gap between the smooth plate 105 and the substrate 101 and adheres to the rollers 106a and 106b and/or peripheral members of the production apparatus. As a result, the attached resin portion 103a is required to be removed, thus resulting in a lowering in productivity.

Further, as shown in FIGS. 6 and 7, in order to completely remove air bubbles 110 incorporated in the UV-curable resin 103 by pressure application with the rollers 106a and 106b in the pressing step of the laminate, it is necessary to set an amount of the resin 103 to be larger than a minimum necessary amount thereof in advance.

In this case, however, similarly as in the case shown in FIG. 5, an excessive resin portion 103a containing the air bubble 110 is discharged from the laminate to attach to the rollers 106a and 106b and/or members (parts) of the production apparatus, thus requiring every time a removal step for removing or wiping the attached resin portion 103a.

SUMMARY OF THE INVENTION

In view of the above-mentioned problems, an object of the present invention is to provide a process for producing an electrode plate capable of preventing an adverse influence of air bubbles generated during production steps thereof and to provide a process for producing a liquid crystal device including the electrode plate.

Another object of the resent invention is to provide a process for producing an electrode plate capable of preventing flowing-out of a resin during a pressing step to ensure uniform embedding of metal electrodes with the resin in a region to be filled, a production apparatus of the electrode plate and a process for producing a liquid crystal device including the electrode plate.

According to a first aspect of the present invention, there is provided a process for producing an electrode plate comprising a substrate, a plurality of stripe-shaped electrodes with gaps therebetween, and a flattening layer filling the gaps; the process comprising the steps of:

supplying a flowable polymeric material to a part of a surface of a smooth plate or substrate, applying the smooth plate and the substrate to each other so as to sandwich the polymeric material therebetween to provide a laminate, pressing the smooth plate and the substrate to each other, the pressing step including a preliminary pressure step wherein a pressed portion is moved from a first side of the laminate to a second side parallel to the first side under application of a first pressure and a main pressure step wherein a pressed portion is moved from one side of the laminate to the other side parallel to the one side under application of a second pressure larger than the first pressure to extend the polymeric material over at least a region including the stripe-shaped electrodes, curing the polymeric material by irradiation with a light to form a flattening layer, and removing the smooth plate from the laminate.

According to the first aspect of the present invention, there is also provided a process for producing a liquid crystal device in which a liquid crystal is disposed between a pair of plates including at least one electrode plate comprising:

a substrate, a plurality of stripe-shaped electrodes with gaps therebetween, and a flattening layer filling the gaps; the process comprising the steps of:

supplying a flowable polymeric material to a part of a surface of a smooth plate or substrate, applying the smooth plate and the substrate to each other so as to sandwich the polymeric material therebetween to provide a laminate, pressing the smooth plate and the substrate to each other, the pressing step including a preliminary pressure step wherein a pressed portion is moved from a first side of the laminate to a second side parallel to the first side under application of a first pressure and a main pressure step wherein a pressed portion is moved from one side of the laminate to the other side parallel to the one side under application of a second pressure larger than the first pressure to extend the polymeric material over at least a region including the stripe-shaped electrodes, curing the polymeric material by irradiation with a light to form a flattening layer, and removing the smooth plate from the laminate, forming a plurality of principal electrodes on the flattening layer and stripe-shaped electrodes, oppositely disposing the pair of plates including at least one electrode plate provided with the principal electrodes formed on the flattening layer and stripe-shaped electrodes so as to leave a gap between the plates, and filling the gap with the liquid crystal.

According to a second aspect of the present invention, there is provided a process for producing an electrode plate comprising the steps of:

forming on a substrate a plurality of electrodes with gaps therebetween in a prescribed pattern, placing a flowable resin between the substrate and a smooth plate, pressing a laminate including the substrate and the smooth plate to each other so as to ensure an intimate contact between the smooth plate and the electrodes formed on the substrate while extending the flowable resin, curing the flowable resin, removing the smooth plate from the substrate having thereon the cured resin to prepare an electrode plate comprising the substrate provided with the electrodes embedded flatly with the cured resin disposed at the gaps of the electrodes, wherein the smooth plate has a size larger than that of a region to be filled with the resin and smaller than that of the substrate, and the pressing is performed in a region having a size larger than that of the region to be filled with the resin and smaller than that of the substrate.

According to the second aspect of the present invention, there is also provided an apparatus for producing an electrode plate, including:

a smooth plate, a substrate provided with a plurality of electrodes with gaps therebetween to be filled with a flowable resin, means for placing dropwise the flowable resin at a prescribed position of the substrate, means for pressing a laminate including the smooth plate and the substrate between which the flowable resin is sandwiched so that the flowable resin extends over a region to be filled with the resin to ensure an intimate contact between the smooth plate and the electrodes provided to the substrate, means for curing the flowable resin, and means for positioning the smooth plate so as to correspond to the region to be filled with the resin;

wherein the smooth plate has a size larger than that of a region to be filled with the resin and smaller than that of the substrate, and the pressing is performed in a region having a size larger than that of the region to be filled with the resin and smaller than that of the substrate, and the smooth plate is removed from the substrate having thereon the resin to prepare an electrode plate comprising the substrate provided with the electrodes embedded flatly with the cured resin disposed at the gaps of the electrodes.

According to the second aspect of the present invention, there is further provided a process for producing a liquid crystal device in which a liquid crystal is disposed between a pair of oppositely disposed plates including at least one electrode plate; the process comprising the steps of:

forming on a substrate a plurality of electrodes with gaps therebetween in a prescribed pattern, placing a flowable resin between the substrate and a smooth plate, pressing a laminate including the substrate and the smooth plate to each other so as to ensure an intimate contact between the smooth plate and the electrodes formed on the substrate while extending the flowable resin, curing the flowable resin, removing the smooth plate from the substrate having thereon the cured resin to prepare an electrode plate comprising the substrate provided with the electrodes embedded flatly with the cured resin disposed at the gaps of the electrodes, forming a plurality of principal electrodes on the cured resin and electrodes, oppositely disposing the pair of plates including at least one electrode plate provided with the principal electrodes formed on the flattening layer and electrodes so as to leave a gap between the plates, and filling the gap with the liquid crystal, wherein the smooth plate has a size larger than that of a region to be filled with the resin and smaller than that of the substrate, and the pressing is performed in a region having a size larger than that of the region to be filled with the resin and smaller than that of the substrate.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4–7 are schematic sectional views for explaining a problem in an ordinary production process of an electrode plate, respectively.

FIG. 17 is a schematic sectional view of a pressing step in a fourth embodiment of the production process of an electrode plate according to the first aspect of the present invention.

FIGS. 18A and 18B are schematic sectional views for a resin-supplying step in a still another embodiment of the production process of an electrode plate according to the first aspect of the present invention.

FIG. 19 is a schematic sectional view of a substrate provided with metal electrodes used in the production process of an electrode plate according to the present invention.

FIGS. 20A–20D are schematic sectional views of a step for forming metal electrodes on a substrate used in the production process of an electrode plate of the present invention.

DESCRIPTION OF THE PREFERRED EMBODIMENTS

Figure 8:
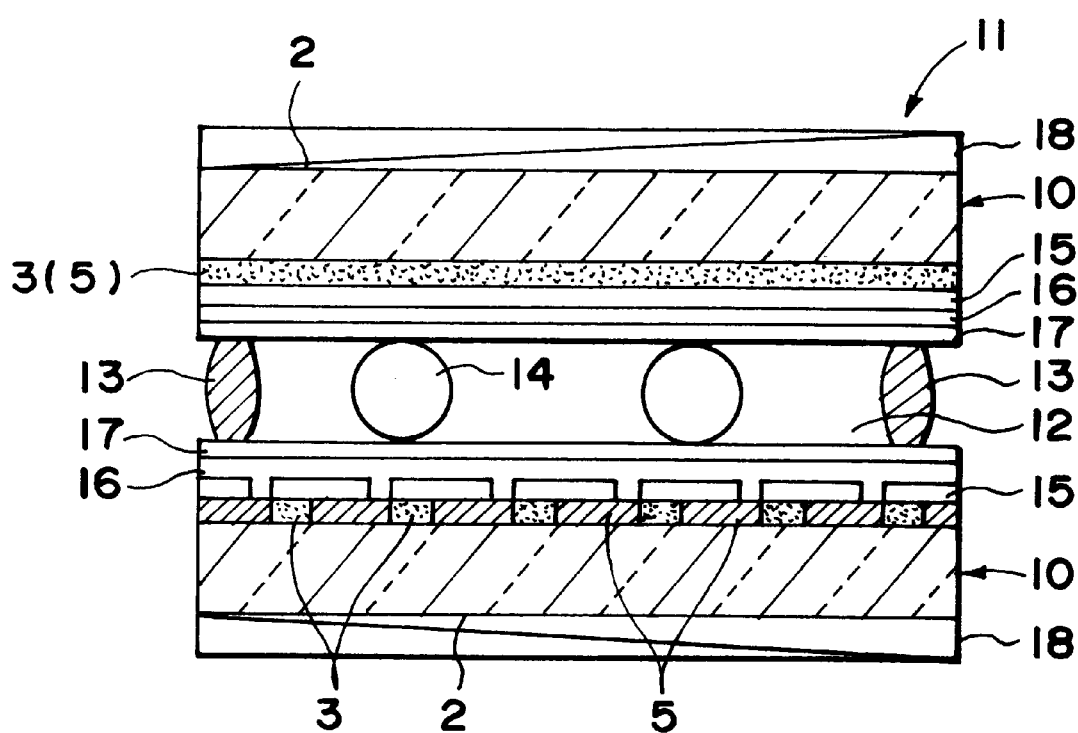
FIG. 8 is a schematic sectional view of an embodiment of a liquid crystal device produced through the production process according to the present invention.

FIG. 8 shows an example of a liquid crystal device produced through the process according to the present invention.

Referring to FIG. 8, a liquid crystal device 11 includes a pair of oppositely disposed electrode plates 10 sandwiched between a pair of polarizers 18, and a liquid crystal 12, such as a chiral smectic liquid crystal or a nematic liquid crystal, disposed between the electrode plates 10 together with (spherical) spacer beads 14 and a sealing agent 13 for regulating a prescribed cell gap (or thickness of the liquid crystal layer 12 of, e.g., 1.5 $\mu$m).

Each electrode plate 10 includes a glass substrate 2, a plurality of metal electrodes 3 of, e.g., aluminum with gaps therebetween and formed in a prescribed pattern on the glass substrate 2, an insulating layer of a resin 5 (e.g., UV-curable resin) filling the gaps between the metal electrodes 3 to form a flat surface in combination with the metal electrodes 3, and a plurality of transparent electrodes 15 of, e.g., ITO film formed on the flat surface and each electrically connected with an associated metal electrode 3.

The transparent electrodes 15 are formed in a stripe shape and intersect with each other at right angles to form an electrode matrix in combination. On each transparent electrodes 15, an optional insulating layer 16 and an alignment layer (film) 17 are formed.

Herein, the transparent electrodes 15 constitute principal electrodes for the liquid crystal device and the metal electrodes 3 function as auxiliary electrodes for decreasing an electrical resistance of the transparent electrodes 15.

Hereinbelow, a generic embodiment of the process for producing an electrode plate according to a first aspect of the present invention will be described with reference to FIGS. 9, 10, 11, 19 and 20.

First, a wiring substrate 4 including a substrate 2 of a transparent or reflective material (e.g., a glass plate) and a plurality of stripe-shaped metal electrodes 3 (metal wiring pattern) formed on the substrate 2 is prepared through steps shown in FIGS. 20A–20D.

A metal layer 23 is formed in a prescribed thickness (e.g., ca. 1 $\mu$m) on the entire (upper) surface of the substrate by sputtering (FIG. 20A), and thereon, a photoresist layer 24 is formed by spin coating and is exposed to light via a photomask 25 having an opening corresponding to the metal wiring pattern (FIG. 20B). Thereafter, the photoresist layer 24 is subjected to development, followed by post-baking as desired to obtain a resist (etching) pattern 24' disposed on the metal layer 23 (FIG. 20C). Then, the thus-treated substrate 2 is subjected to etching treatment (e.g., dipping in an etchant) to remove a part of metal layer 23 not coated with the resist 24', followed by a removal of the resist 24' to obtain a prescribed (stripe-shaped) pattern of the metal electrodes 3 (FIG. 20D).

In the present invention, the metal electrodes 3 may comprise a metallic material of Ni, Mo, Cr, W, Ta, Ag, Cu in addition to the above-mentioned Al showing a low resistivity; an electroconductive resin; and electroconductive ceramics.

Further, it is possible to provide the wiring substrate with a function of a color filter by forming in a prescribed thickness a color filter layer (pattern) in gaps between the metal electrodes 3 in advance through a known process, such as photolithography, printing, a sublimation transfer method or an ink jet method.

The color filter layer may be formed on the substrate 2 and then may be coated with the stripe-shaped metal electrodes 3 through the above-mentioned steps (FIGS. 20A–20D). In this case, between the metal electrodes 3 and the color filter layer, a protective layer of a resinous material having a function of protecting and flattening the uneven color filter pattern may preferably be formed, thus preventing a change in color of the underlying color filter in the etching step (particularly using, e.g., an acid-type etchant) for forming the metal electrodes 3.

Next, by using the thus-prepared wiring substrate 4, an electrode plate is prepared through steps shown in FIGS. 9–11.

Figure 9A:
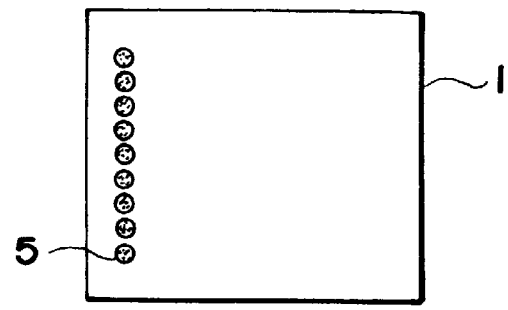
FIGS. 9A–9F are schematic views for illustrating principal production steps involved in the process for producing an electrode plate according to a first aspect of the present invention.
Figure 9B:
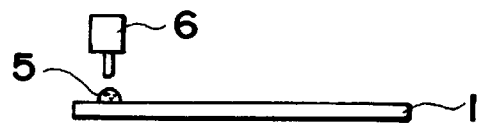

At one (extending) end portion of a smooth plate 1 proximity and parallel to one side of the smooth plate 1 (but extending in a direction perpendicular to a longitudinal (extension) direction of the metal electrodes 3 disposed opposite to the smooth plate 1 in a later step), a prescribed amount of a UV-curable resin 5 is supplied dropwise to the surface of the smooth plate 1 by using a dispenser 6 (FIGS. 9A and 9B).

Figure 9C:
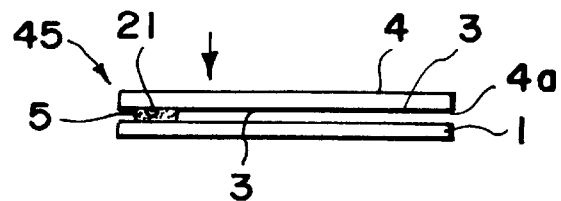

On the smooth plate 1, the wiring substrate 4 having a wiring surface 4a where the (ca. 1 μm-thick) metal electrodes 3 are formed is superposed so as to sandwich the resin 5 between the wiring surface 4a and the smooth plate surface to obtain a laminate 45 (FIG. 9C).

Figure 9D:
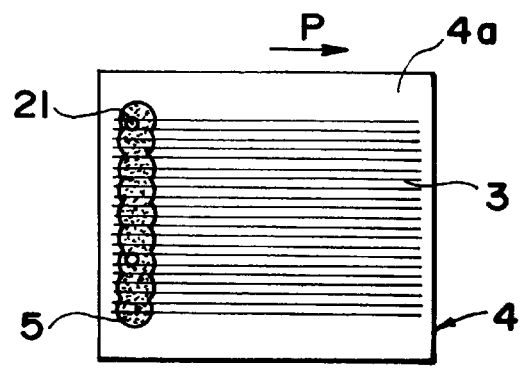
Figure 9E:
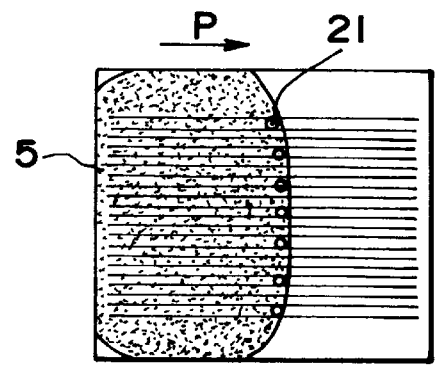
Figure 9F:
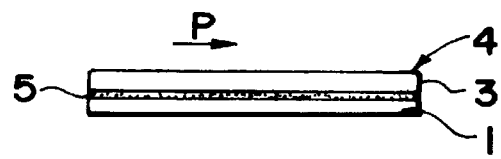

The laminate 45, preferably in a heated state allowing an increased flowability of the resin 5, is inserted and passed between a pair of rotating fixed rollers (not shown) so that a pressed portion first located at the above-mentioned one end portion (corr. to the supplied resin portion) is moved relative to the fixed rollers in a direction of an arrow P parallel to the metal electrode extension direction toward the other end portion of the smooth plate 1 (laminate 45) (FIGS. 9D and 9E). As a result, the resin 5 is spread or extended along the metal electrode extension direction to fill the gaps between the metal electrodes 3 while removing a resin portion remaining on the metal electrode surface b appropriately setting a pressing pressure, thus ensuring an intimate contact state between the smooth plate 1 and the wiring substrate 4 (FIG. 9F).

Figure 10A:
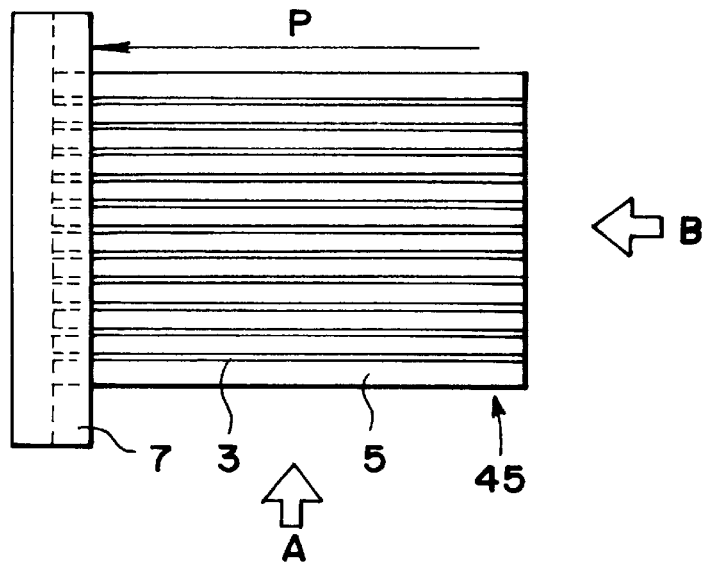
FIGS. 10A–10C and FIGS. 11A–11C are respectively schematic views of a pressing step involved in the production process of an electrode plate according to the first aspect of the present invention.
Figure 10B:
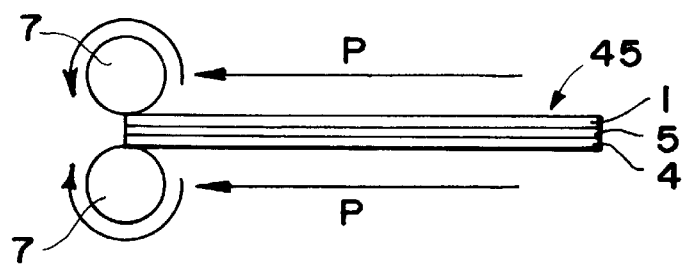
Figure 10C:
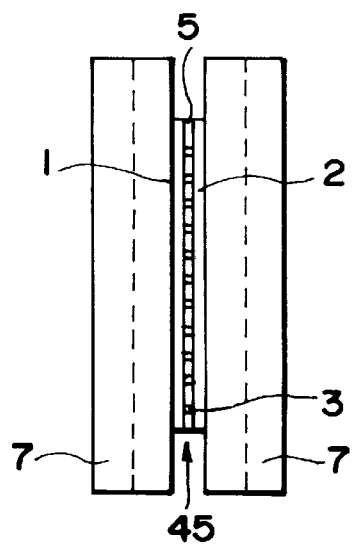

This pressing step will be specifically described with reference to FIGS. 10A–10C wherein FIG. 10A shows a plan view of the laminate 45 pressed by the rollers 7 at the time of pressing operation, FIG. 10B shows a corresponding sectional view viewed from an A side (shown in FIG. 10A) and FIG. 10C also shows a corresponding sectional view viewed from a B side (shown in FIG. 10A).

In the pressing operation, the laminate 45 is passed between the pair of fixed rollers 7, whereby a pressed portion is moved along the metal electrode extension direction in a direction of an arrow P relative to the fixed rollers 7. At this time, the moving direction P of the pressed portion is not necessarily required to be completely parallel to the metal electrode extension direction.

Figure 11A:
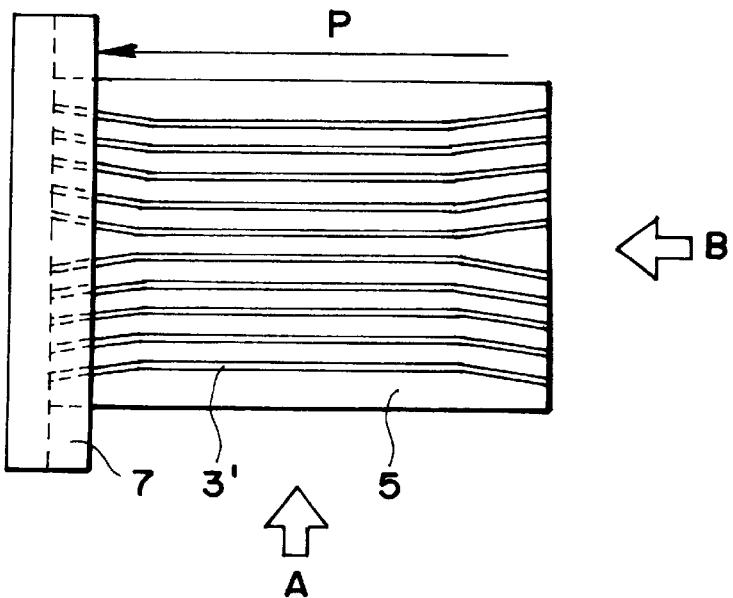
Figure 11B:
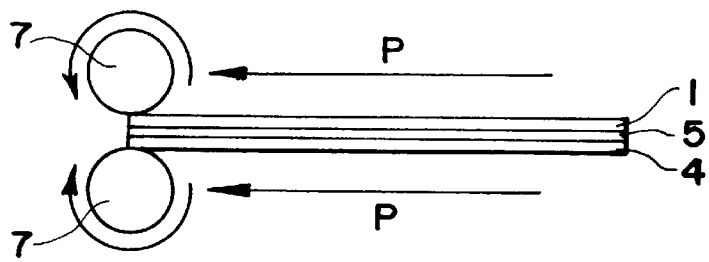
Figure 11C:
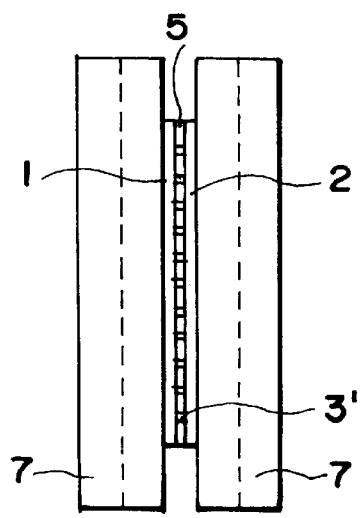

For instance, in the case where each metal electrode 3 is bent at both outer portions each closer to an end portion as shown in FIG. 11A, the moving direction P of the pressed portion may be taken in parallel with inner parallel portions of the metal electrodes 3 so as to extend the resin 5 outside by pressure application. FIGS. 11B and 11C are sectional views viewed from an A side and a B side (shown in FIG. 11A), respectively.

Figure 1A:
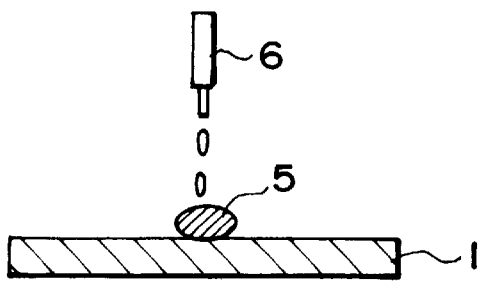
FIGS. 1A–1G, FIGS. 2A–2E and FIGS. 3A–3H are respectively schematic sectional views for illustrating an embodiment of an ordinary process for producing an electrode plate.
Figure 1B:
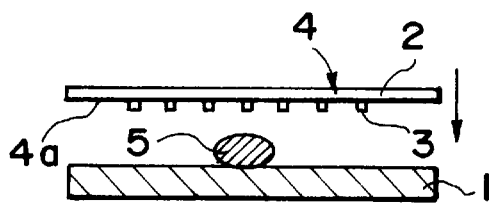
Figure 1C:
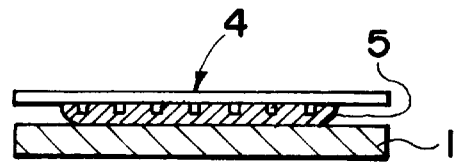
Figure 1D:
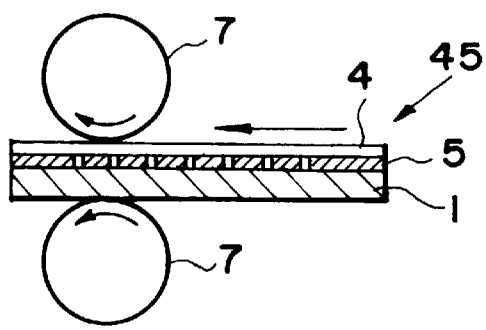
Figure 1E:
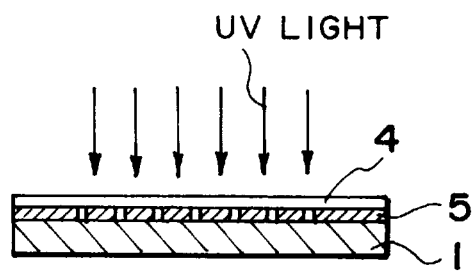
Figure 1F:
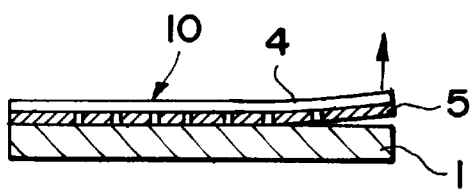
Figure 1G:
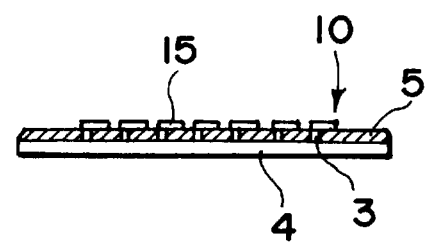
Figure 2A:
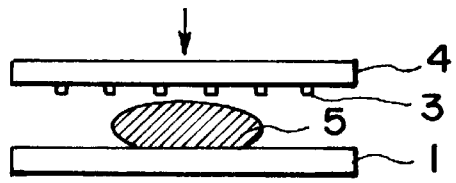
Figure 2B:
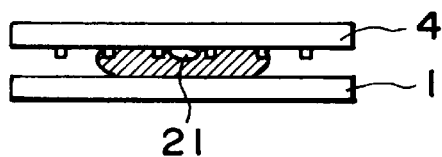
Figure 2C:
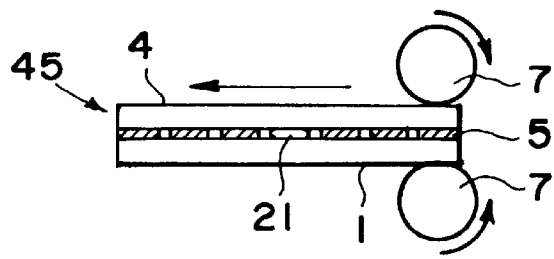
Figure 2D:
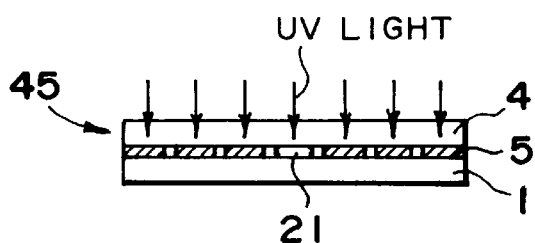
Figure 2E:
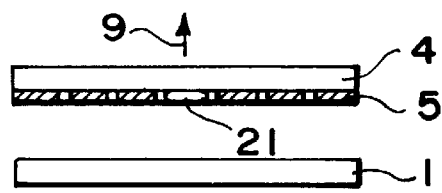
Figure 3A:
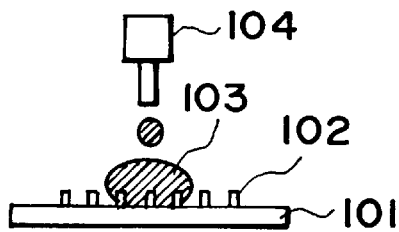
Figure 3B:
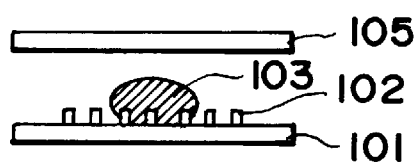
Figure 3C:
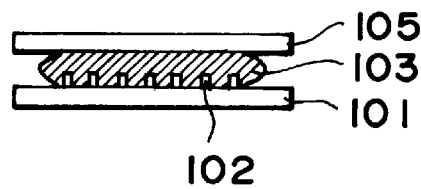
Figure 3D:
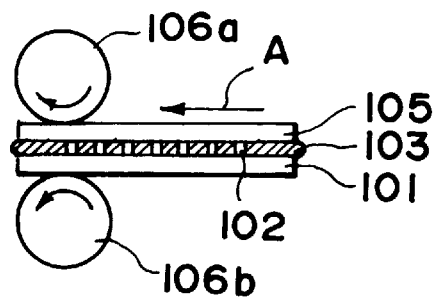
Figure 3E:
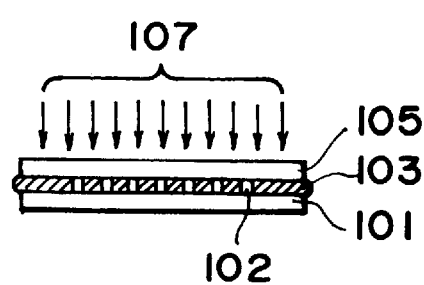
Figure 3F:
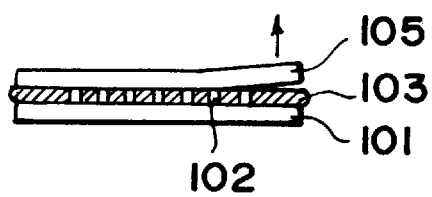
Figure 3G:
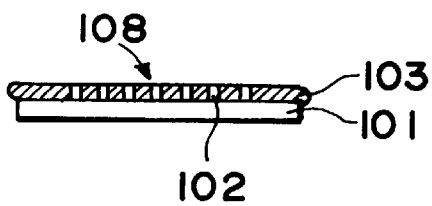
Figure 3H:
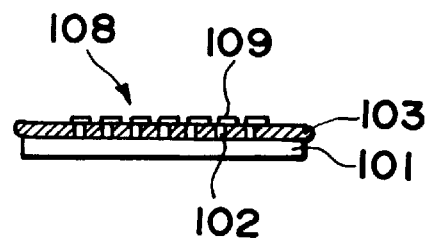

The thus pressed laminate is then used for preparing an electrode plate through similar steps as shown in FIGS. 1E–1G. Specifically, referring again to FIG. 1E, when the substrate 4 is a light-transmissive substrate, the extended resin 5 is irradiate with UV light (UV rays) to be cured. The substrate having thereon the metal electrodes 3 embedded flat with the UV-cured resin 5 is separated from the smooth plate 1 (FIG. 1F) and is coated with a plurality of transparent electrodes (of, e.g., ITO film) to obtain an electrode plate 10 (FIG. 1G).

In the present invention, the UV-curable resin 5 may be replaced by another curable material such as infrared-curable resin or thermosetting resin. In such a case, the step shown in FIG. 1E may be appropriately modified.

Figure 12:
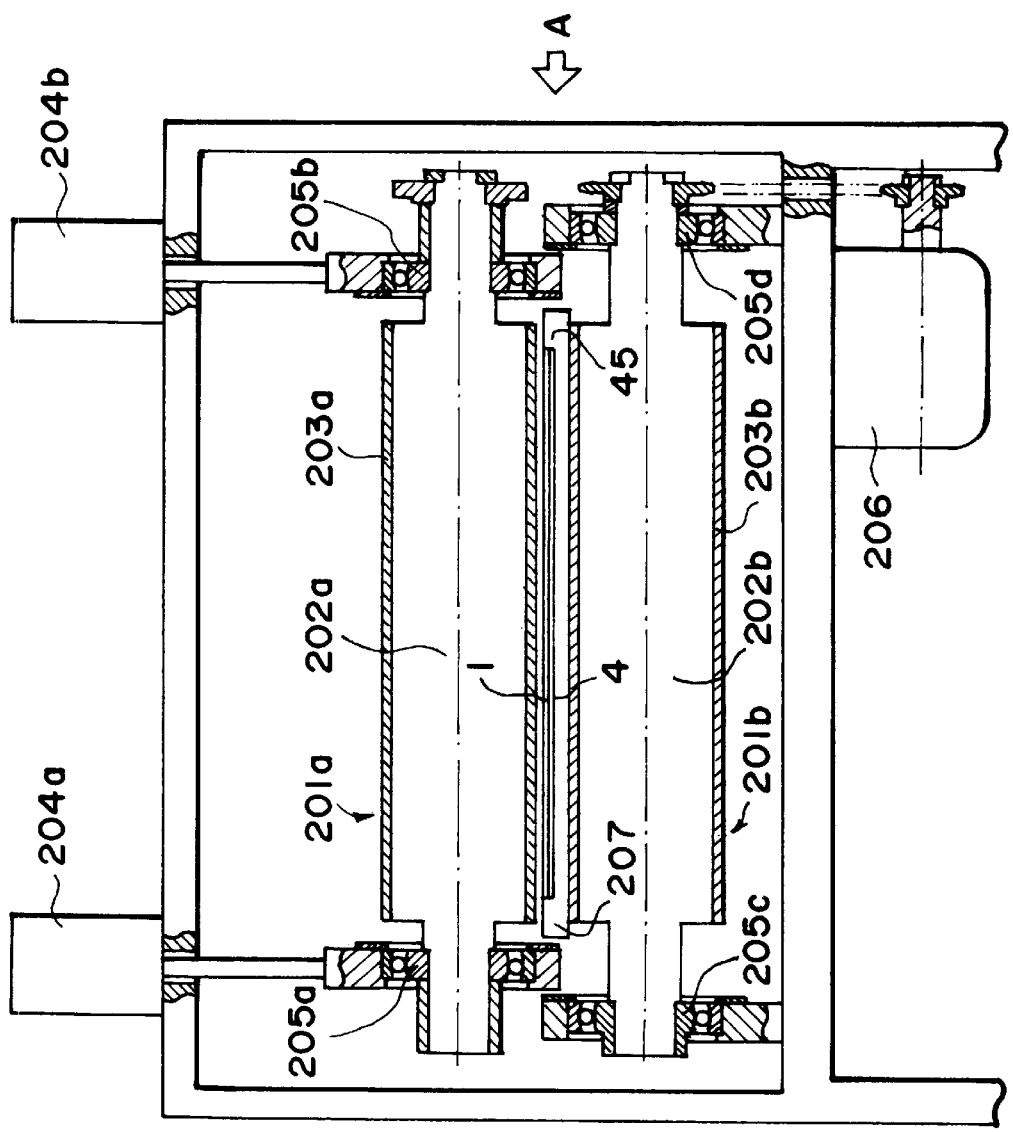
FIG. 12 is a schematic sectional view of an embodiment of a pressing apparatus used in the process for producing an electrode plate according to the present invention.

In the above pressing step, a pressing apparatus as shown in FIG. 12 may generally be used.

Referring to FIG. 12, the pressing apparatus includes a pair of pressure rollers 201a and 201b corresponding to the above-mentioned pair of rollers 7 as shown in FIGS. 10 and 11.

Each pressure roller 201a (201b) comprises a shaft (core metal) 202a (202b) coated with an elastic material 203a (203b).

A load exerted on the rollers 201a and 201b is supplied by pressing both end portions of each roller with two air cylinders 204a and 204b. At this time, as bearings for the rollers 201a and 201b, roller shaft-adjusting bearings 205a, 205b, 205c and 205d are used to equalize a pressure loading exerted on a roller-pressing jig 207 (for holding and supporting the laminate 45) in which the laminate 45 including the smooth plate 1 and the wiring substrate 4 is set or secured. The rollers 201a and 201b are driven by a servomotor 206.

Figure 13:
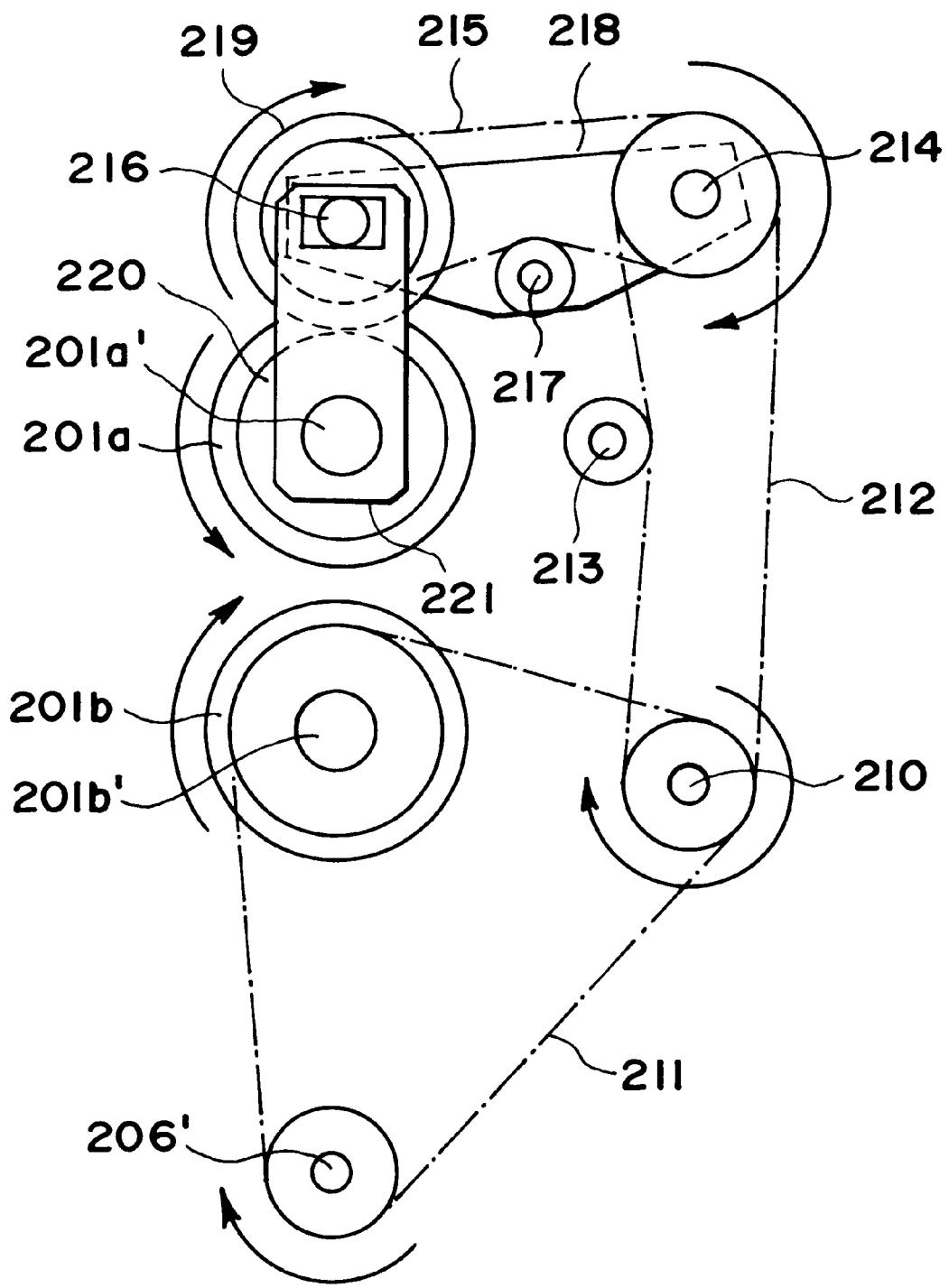
FIG. 13 is a schematic sectional view of the pressing apparatus viewed from an A side shown in FIG. 12.

As shown in FIG. 13 illustrating a sectional structure of the pressing apparatus viewed from an A side shown in FIG. 12, one of servomotor shaft (axes) 206' is used as a driving shaft so as to rotate the pair of rollers 201a an 201b at an identical speed. A driving force is shared out between a (lower) roller shaft 201b' through a chain 211 and a rotation shaft 214 through a chain 212 by the medium of a dividing shaft 110 having two sprockets. In this instance, in order to adjust a slack in the chain 212, a tension adjuster is provided.

The driving force transmitted to the rotation shaft 214 is transmitted to a rotation shaft 216 through a chain 215. In this case, a tension adjuster 217 is provided so as to adjust a slack in the chain 215.

The driving force transmitted to the rotation shaft 216 is transmitted to a rotation shaft 201a' via gears 219 and 220.

The (upper) roller 201a must be designed to rotate at a speed equal to that of the (lower) roller 201b and also to be movable vertically. For this reason, the rotation shafts 214 and 216 and a rotation shaft for the tension adjuster 217 are integrated by a swing arm 218 which is swung mating with the rotation shaft 214.

Further, the rotation shafts 216 and 201a' are connected by a connecting part 221 capable of moving vertically only by means of a linear guide rail, thus compatibly allowing the rotation and vertical movement of the (upper) roller 201a.

The rotation shaft 216 is slightly moved in a longitudinal direction at the time of moving the swing arm 218, so that the connecting part 221 supports the rotation shaft 216 by an elongated hole in order to obviate a positional deviation.

Then, the production process of the above-mentioned liquid crystal device 11 will be described based on FIGS. 21A–21E.

Figure 21A:
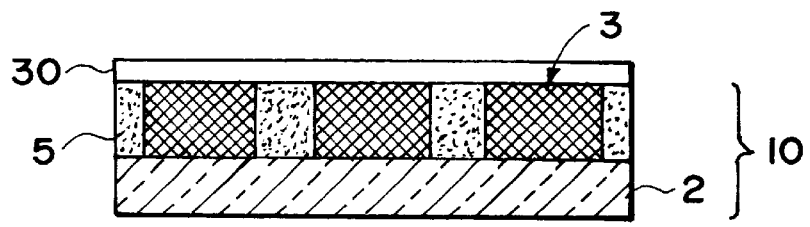
FIGS. 21A–21E and FIGS. 24A–24D are respectively schematic sectional views for production steps involved in an embodiment of the process for producing a liquid crystal device of the present invention.

Referring to FIG. 21A, an electrode plate 10 is prepared in a similar manner as in the production steps shown in FIGS. 9–11. On the electrode plate 10 (on the surface of the metal electrodes 3 and resin 5), a layer 30 of ITO (indium tin oxide) for constituting transparent electrodes is formed in a thickness (e.g., ca. 700 Å) by sputtering.

Figure 21B:
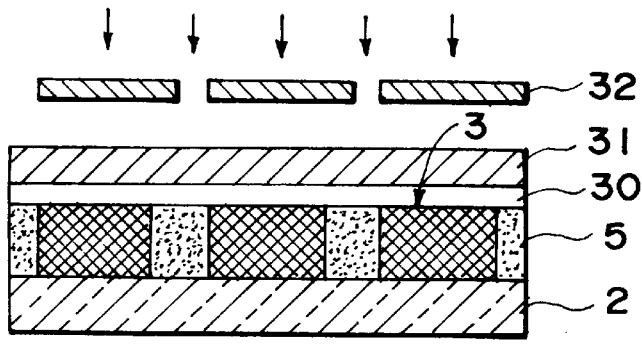
Figure 21C:
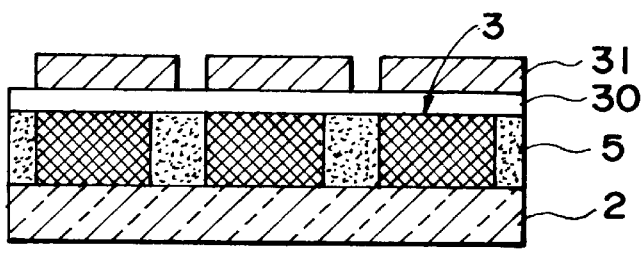

Then, on the ITO layer 30, a layer of photoresist 31 (e.g., ca. 2 μm thick) is spin-coated and exposed to light via a photomask 32 having a prescribed pattern corresponding to an electrode pattern to be formed, followed by development and post-baking to form an etching pattern (FIGS. 21B and 21C).

Figure 21D:
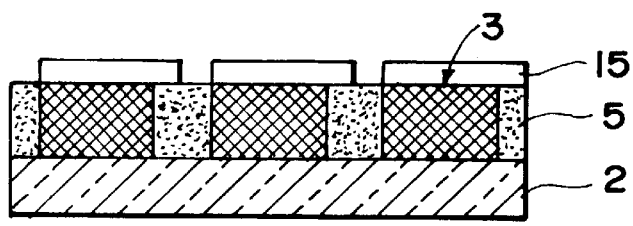

The thus-treated substrate 2 is then immersed in an etchant (e.g., hydroiodic acid) to etch an ITO layer portion not covered with the photoresist layer 31, followed by removal of the photoresist layer 31 to obtain a plurality of transparent electrodes 15 each electrically connected with an associated metal electrode 3 (FIG. 21D).

Figure 21E:
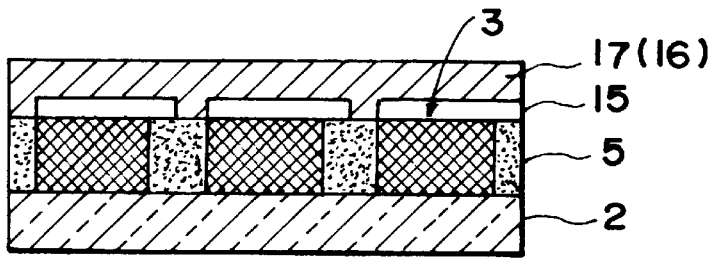

On the transparent electrodes 15, after forming an insulating layer 16 of, e.g., TaOx, as desired a 1.5 wt. %-solution of polyamic acid ("LQ 1800", mfd. by Hitachi Kasei Kogyo K.K.) in an N-methylpyrrolidone/n-butyl cellosolve (=1/1) is applied by spin coating at 2000 rpm for 20 sec., followed by hot baking at 270° C. for 1 hour to form an alignment control film 17 (e.g., ca. 200 Å-thick) (FIG. 21E). The alignment control film 17 is then subjected to rubbing treatment.

On one of the pair of substrates 2, (spherical) spacer beads 14 are dispersed, and on the periphery of the other substrate, a sealing agent 13 (e.g., epoxy resin) is applied by flexographic printing. The pair of substrates 2 thus treated are applied to each other so that rubbing axes of the alignment control films 17 for the pair of substrates 2, respectively, are parallel to each other or cross each other at a crossing angle of several degrees while leaving a cell gap therebetween, which is then filled with a liquid crystal 12 to prepare a liquid crystal device 20 shown in FIG. 8.

Incidentally, in the above-described pressing step as shown in FIGS. 9D and 9E, the viscosity of the resin 5 is required to be relatively low in order to ensure an intimate contact of the metal electrode 3 surface with the surface of the smooth plate 1. Accordingly, the resin 5 (together with the substrate 4 and the smooth plate 1) is heated to a certain temperature in some cases.

In this case, the laminate 45 as shown in FIG. 9C (prepared through the steps shown in FIGS. 9A and 9B described above) is heated while incorporating therein air bubbles 21.

Figure 14A:
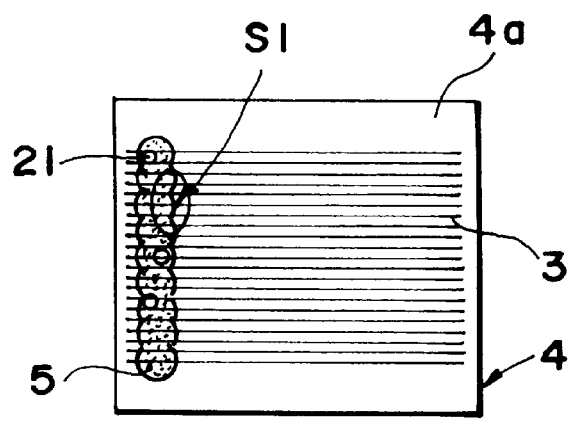
FIGS. 14A–14C and FIGS. 15A–15C respectively show a state of generation of air bubbles and a state of growth thereof in a production process of an electrode plate.
Figure 14B:
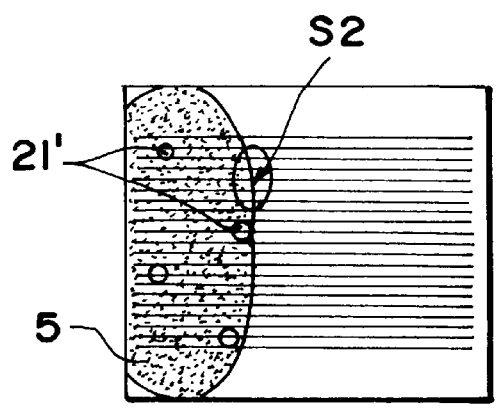
Figure 14C:
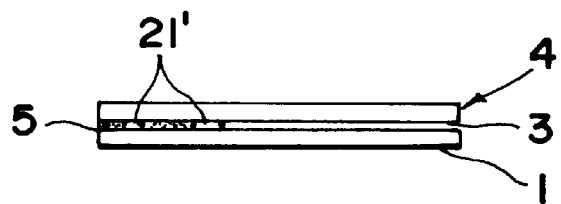

In such a heated state, the viscosity of the heated resin 5 becomes too low if a heating temperature is high, so that the heated resin 5 is quickly spread along the metal electrode stripes while decreasing its thickness (height) which varies depending on a deflection and incline of the substrate as shown in FIGS. 14A–14C, wherein FIGS. 14B and 14C respectively show the case where the resin 5 is thinning toward the right-hand side on the drawing. In this case, the resin spreading speed is quickly lowered as the resin 5 is moved toward the right-hand side. As a result, the resin 5 is not spread by its own weight and thereafter is spread by the capillary action based on a surface tension at the gaps between the metal electrodes 3.

Figure 15A:
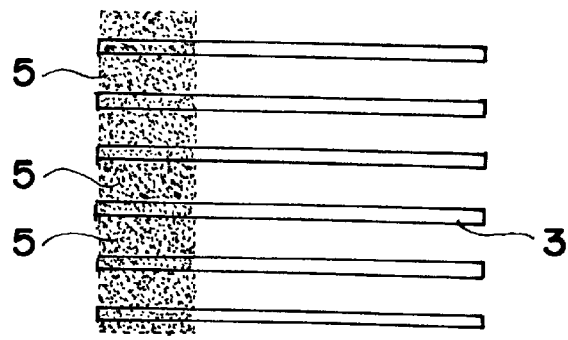
Figure 15B:
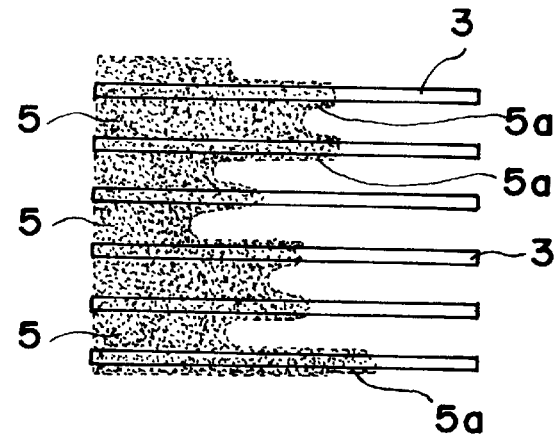
Figure 15C:
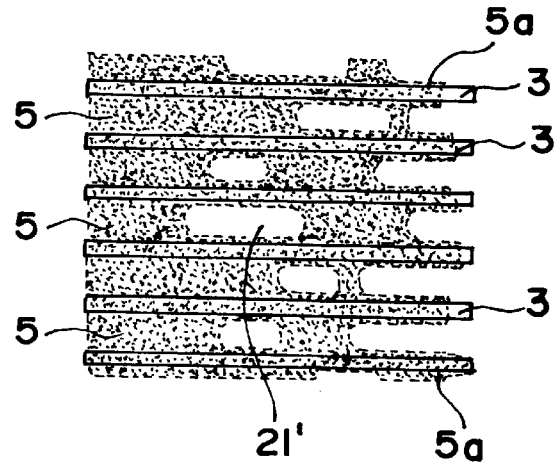

For this reason, a difference between a spacing between the metal electrode 3 surface and smooth plate 1 surface and a spacing between the substrate 4 surface and smooth plate 1 surface before pressure application becomes larger with a decrease in the entire resin thickness. At an initial stage of the pressing step, the resin 5 is uniformly spread as shown in FIG. 15 which is enlarged view of an S1 portion shown in FIG. 14A. The resin 5 is, however, gradually spread ununiformly since resin portions 5a located on the metal electrodes 3 is moved faster than other portions by the capillary action as shown in FIG. 15B. Thereafter, the resin portions 5a are irregularly joined to each other to form air bubbles 21' as shown in FIG. 15C which is an enlarged view of an 52 portion shown in FIG. 14B.

The thus formed air bubbles 21' are not readily moved in some cases even if the resin 5 is caused to flow during the pressing step, thus remaining together with the air bubbles generated in the steps shown in FIGS. 9A–9C in the gaps between the metal electrodes 3 after completion of the pressing operation.

This problem is common to all the cases where a resinous material is supplied to any portion of the substrate 4 or the smooth plate 1.

The production process according to the first aspect of the present invention effectively solve the above problem.

Hereinbelow, a first embodiment of the production process according to the first aspect of the present invention will be explained with reference to FIGS. 16A–16E.

Figure 16A:
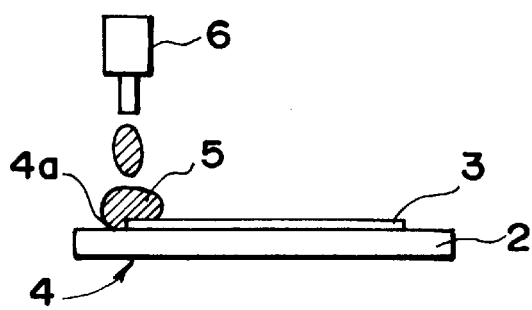
FIGS. 16A–16E are schematic sectional views of production steps for illustrating a first embodiment of the process for producing an electrode plate according to the first aspect of the present invention.

As shown in FIG. 16A, on the wiring substrate 4 (prepared though the steps shown in FIG. 19 and FIGS. 20A–20D described above), a prescribed amount of a resin 5 (polymeric material) is placed dropwise by, e.g., a dispenser 6 at one end portion of a wiring surface 4a (metal electrodes 3), which portion extending perpendicular to a longitudinal (extension) direction of the metal electrodes 3 (having the stripe-shaped pattern as shown in FIG. 9D).

In this step, the dropping amount of the resin 5 may preferably be set to be ca. 10 to cal. 50 times as large as a minimum necessary amount for completely filling the gaps between the metal electrodes 3, whereby it is possible to ensure the spacing between the substrate 4 and the smooth plate 1 as large as possible, thus obtaining a large amount of the flowing resin 5 in a preliminary pressure step and covering a region larger than the metal electrode gap region with the resin 5 as specifically described hereinafter.

Figure 16B:
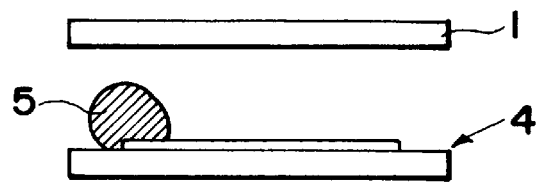
Figure 16C:
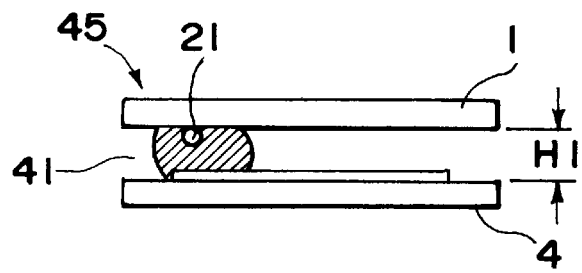

Next, as shown in FIGS. 16B and 16C, on the substrate 4, the smooth plate 1 is superposed so as to sandwich the resin 5. At this time, the smooth plate 1 may desirably be caused to contact the resin 5 as slow as possible since the quick contact operation of the smooth plate 1 with the resin 5 increases a possibility of inclusion of air bubbles 21. A spacing H1 between the substrate 4 surface (wiring surface 4a) and the smooth plate 1 surface may preferably be set so that a spacing between the metal electrode 3 surface and the smooth plate surface becomes larger than the metal electrode thickness, thus preparing a laminate 45. The spacing H1 may preferably be set to be 50–200 times the metal electrode thickness.

Figure 16D:
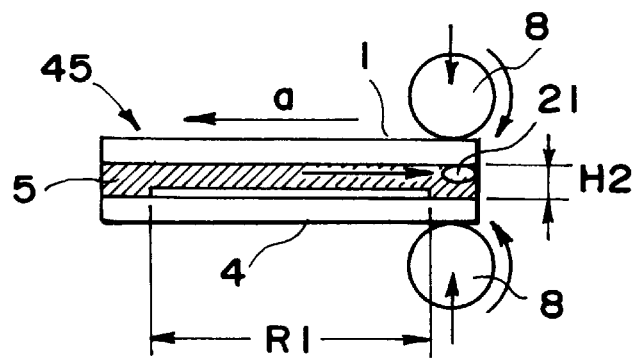

Thereafter, as shown in FIG. 16D, the laminate 45 is inserted in a direction of an arrow a between a pair of first pressing rollers 8 as preliminary pressure means oppositely disposed to each other and rotating in the indicated arrows, thus pressing the laminate 45 preferably in an unheated state.

This first pressing step is not intended to press the smooth plate 1 against the metal electrode surface but intended to spread the resin 5 over a larger region including a region R1 where the gaps between the metal electrodes 3 are filled with the resin 5 while keeping a spacing 41 between the smooth plate 1 surface and the substrate 4 surface to be H2 larger than the metal electrode thickness (herein, this step is referred to as "preliminary pressure step"). The spacing H2 may preferably be set to be 4–10 times the metal electrode thickness.

According to this preliminary pressure step, even when air bubbles 21 are contained in the resin 5 in the preceding step shown in FIG. 16C, the flow of the resin 5 occurring in the pressing operation wherein the spacing 41 (between the substrate 4 and the smooth plate 1) decreased from H1 to H2 (FIGS. 16C and 16D) allows the air bubbles 21 to be moved in a direction of the indicated arrow (shown in the resin 5 of FIG. 16D) opposite to the laminate moving direction of the arrow a.

As a result, the air bubbles 21 are discharged from a rear end of the moved laminate 45 together with an excessive resin portion or moved outside the region R1 (to be filled with the resin 5), thus preventing an adverse influence on the resultant electrode plate (liquid crystal device).

Even if in a later (second) pressing step the resin 4 is required to lower its viscosity and the pressing operation is performed in a high-temperature environment, the region has already been completely filled with the resin 5, thus not generating air bubbles due to the capillary action.

Conditions for the above-mentioned preliminary pressure step may include various combinations depending on a viscosity of the resin 5 and a capacity of the first pressing rollers 8. In this embodiment, a pressing force may desirably be set at a minimum necessary level allowing the required resin flow (extension) and the spacing 41 (H2) may preferably be set to be a value as large as possible in order to ensure a flowing passage of the resin 5 in the subsequent (second) pressing step.

The first pressing rollers 8 used in the preliminary pressure step may be identical to those used in the second pressing step except for pressing conditions. If the pressing conditions such as a pressure, a temperature and a rotation speed are determined in advance, the first pressing roller 8 only used for the preliminary pressure step may be advantageous to cost saving of the entire apparatus in some cases.

Figure 16E:
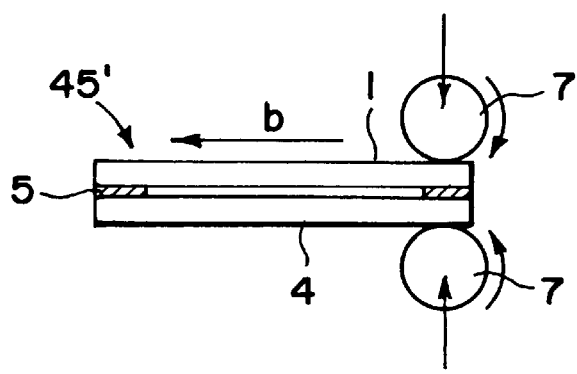

After completion of the preliminary pressure step, as shown in FIG. 16E, the laminate 45' preliminarily pressed is inserted in a direction of an arrow b between a pair of second pressing rollers 7 as main pressure means oppositely disposed to each other and rotating in the indicated arrows, thus pressing the laminate 45' from the left side to the right side to remove the resin 5 from the metal electrode surface. Consequently, the smooth plate 1 is caused to firmly and uniformly contact the entire substrate 4 via the metal electrodes 3 (herein, this step is referred to as "main pressure step").

In the case where the resin 5 used has a relatively high viscosity and is not readily removed from the metal electrode surface, the main pressure step is performed in a high-temperature environment in which the resin 5 is heated to lower its viscosity, thus readily remove the resin 5 from the metal electrode surface.

In the above-mentioned preliminary pressure step and/or main pressure step, a pressed portion of the laminate 45 (45') may preferably be moved along the longitudinal direction of the metal electrodes 3 as shown in FIGS. 10 and 11. Further, the pressing apparatus as shown in FIGS. 12 and 13 may desirably be used.

The thus pressed laminate 45' is then subjected to the subsequent steps as described above (as shown in FIGS. 1E–1G and FIGS. 21A–21E) to prepare a liquid crystal device 11 as shown in FIG. 8.

Hereinbelow, a specific example of the above embodiment will be described.

A wiring substrate 4 as shown in FIG. 19 was prepared in the following manner through the steps shown in FIGS. 20A–20D.

On a glass substrate 2 (blue plate glass, 300×350×1.1 mm) surface-polished on both sides a plurality of 2 $\mu$m-thick metal electrodes 3 of aluminum were formed by sputtering and photolithography (etching) so as to have a stripe-shaped pattern (pitch =320 $\mu$m, wiring width=20 $\mu$m) to form a wiring substrate 4.

The wiring glass substrate 4 was spin-coated with coupling treating liquid consisting of 1 wt. part of a silane coupling agent ("A-174", mfd. by Nippon Unicar K.K.) and 40 wt. parts of ethyl alcohol, followed by heat-treatment at 100° C. for 20 min. to effect adhesiveness-imparting treatment.

On one end portion of the metal electrodes 3 formed on the wiring surface 4a of the wiring substrate 4, 5 g of an acrylic UV-curable resin 5 (in the form of a monomer solution comprising a mixture of pentaerythritol triacrylate/neopentyl glycol diacrylate/1-hydroxycyclohexyl phenyl ketone (=50/50/2 by weight)) was placed dropwise by using a dispenser 23 (FIG. 16A).

In this step, 5 g of the UV-curable resin 5 was shared out among ten spots equally spaced (e.g., as shown in FIG. 9A) so that the extension direction of these spots was perpendicular to the longitudinal direction of the metal electrodes 3.

Separately, a smooth plate 1 (blue plate glass, 300×340×1.1 mm) surface-polished on both sides (flatness=5 $\mu$m) was prepared.

The smooth plate 1 was superposed on the wiring substrate 4 so as to contact the resin 5 while keeping a spacing 41 (H1) of ca. 200 $\mu$m between the smooth plate 1 and the wiring substrate 4 to form a laminate 45 (FIGS. 16B and 16C). At this time, ten air bubbles having a diameter of 0.5–5 mm were confirmed by eyes.

The laminate 45 was inserted between a pair of pressing rollers 201a and 201b (corr. to the rollers 8 shown in FIG. 16D) of a roll laminating machine (setting load=100 kg) as shown in FIGS. 12 and 13 and pressed at 25° C. under pressing conditions of a roller rotating speed (peripheral speed) of 40 cm/min. and a pressing pressure of ca. 1 kg/cm$^2$, thus effecting a preliminary pressing. Each pressing roller 201a (201b) had a width of 400 mm and comprised a core metal (shaft) (diameter=100 mm) coated with a 10 mm-thick silicone rubber (rubber hardness=60 degrees).

In the above preliminary pressure step, the resin 5 could fill a region including the entire region R1 (to be filled therewith) while keeping a spacing 41 (H2) (between the smooth plate 1 and the substrate 4) of ca. 10 $\mu$m. Further, two air bubbles 21 were left within the laminate 45 but were located outside the region R1, thus not impairing display characteristics (FIG. 16D).

The thus pressed laminate 45 was (preliminarily) heated at 60° C. for 20 min. in an oven for improving a resin-removing ability in a subsequent main pressure step but the heated resin 5 did not cause the capillary action, so that no air bubble generation was observed.

Thereafter, the laminate 45' was subjected to main pressing by using a roll laminating machine (similar to that shown in FIGS. 12 and 13 used in the preliminary pressure step) including a pair of (main) pressing rollers 7 having the specification identical to the rollers 8 under conditions including a roller rotating speed of 20 cm/min., a pressing pressure of ca. 5 kg/cm$^2$ and a pressing temperature of 60° C. (FIG. 16E).

The thus pressed laminate 45' was irradiated with UV rays from the substrate 4 side for 2 min. by using four 100 W high-pressure mercury lamps. Thereafter, the smooth plate 1 was removed from the laminate 45'. Finally, a plurality of transparent electrodes were formed on a flat surface of the metal electrodes and resin to prepare an electrode plate.

In this specific example before the transparent electrode-forming step, in correspondence with the metal electrode pattern, and ITO film pattern (pitch=320 $\mu$m, width=300 $\mu$m) was formed on the metal electrodes 3 of the substrate 4 by photolithography (etching) and subjected to measurement of a resistance with respect to a pattern length of 120 mm. As a result, all the electrode patterns showed a low resistance of at most 800 ohm, thus confirming the preparation of a low-resistance electrode plate with no defect.

As described above, in the first embodiment according to the first aspect of the present invention, air bubbles generated in the laminate 45 can be removed at least outside the metal electrode forming region in the preliminary pressure step performed before the main pressure step, thus suppressing the adverse influence of the air bubbles to improve production yield and cost.

In the above-mentioned first embodiment, the pressed portion is moved along the metal electrode extension direction in the preliminary pressure step and main pressure step after placing the resin at one end portion of the metal electrodes but may be moved in a direction crossing the metal electrode extension direction at a prescribed angle in the preliminary pressure step and/or main pressure step after placing the resin at a certain portion. In the present invention, however, the former operation may desirably be used since the air bubbles 21 incorporated in the resin 5 can be quickly spread and moved along the stripe-shaped metal electrode extension direction and then is discharged from the other side (right-hand side shown in FIGS. 9D and 9E and FIGS. 16D and 16E).

A second embodiment of the production process of an electrode plate according to the first aspect of the present invention will be described.

In this embodiment, the production process of an electrode plate is performed in a similar manner as in the first embodiment except that a cooling step for increasing the resin viscosity is performed before, during or after the preliminary pressure step. More specifically, by increasing the resin viscosity, it is possible not only to attain an effect that the incorporated air bubbles are more readily be removed but also to ensure a larger flowing passage of the resin 5 due to the increased spacing 41 (H2) (shown in FIG. 16D), thus further enhancing the removal of the resin 5.

In a specific example of the second embodiment, before the preliminary pressure step, the laminate 45 was cooled at 5° C. for 30 min. to increase a viscosity of the resin 5. The preliminary pressure step was than performed at room temperature similarly as in that for the first embodiment.

As a result, the entire R1 region to be filed with the resin 5 was completely filled with the resin 5 while keeping the spacing 41 (H2) of 15 µm. After the preliminary pressure step, one air bubble remained in the laminate 45 but was located outside the R1 region, thus being of no problem. Further, the resin 5 did not cause the capillary action during the preliminary pressure step and no air bubble generation was confirmed.

A third embodiment of the production process of an electrode plate according to the first aspect of the present invention will be described.

In this embodiment, an electrode plate is produced in the same manner as in the first embodiment except for increasing the roller rotation speed (e.g., at least 80 cm/min.) of the pressing rollers 8 in the preliminary pressure roller, thus enhancing the flowing speed of the resin 5 to further improving a performance of removing air bubbles 21.

In a specific example of the third embodiment, the pressing rollers 8 were set to have a rotating speed of 100 cm/min. in the preliminary pressure step.

As a result, the entire R1 region was completely filled with the resin 5 while keeping the spacing 41 (H2) of 20 µm. By effecting the preliminary pressure step, all the air bubbles within the laminate 45 were completely discharged outside the laminate 45. Further, after the preliminary pressure step, the resin 5 preliminarily heated did not cause the capillary action, thus suppressing the generation of air bubbles.

A fourth embodiment of the production process of an electrode plate according to the first aspect of the present invention will be explained.

In this embodiment, an electrode plate is prepared in the same manner as in the first embodiment except that a spacing between shafts of the pair of rollers 8 in the preliminary pressure step is fixed to be D1, whereby the spacing 41 (H2) after the preliminary pressure step can be kept at a certain value irrespective of an environmental temperature and a roller rotating speed in the preliminary pressure step. Consequently, a broader resin flowing passage in the subsequent main pressure step can be ensured, thus allowing an easy removal of the resin 5.

In order to further enhance the effect of removing air bubbles incorporated in the laminate 45, the amount of the resin 5 is set to be larger in advance to ensure a larger spacing 41 (H2) (shown in FIG. 16D). Accordingly, the supplied resin amount is set as large as possible and the spacing between the pair of pressing rollers 8 is appropriately set, whereby the removal performance of the air bubbles 21 incorporated during the laminating step and the removal performance of the resin 5 remaining on the metal electrodes 3 during the preliminary pressure step can be appropriately controlled.

In a specific example of the fourth embodiment, an electrode plate was produced in the same manner as in the first embodiment except that a spacing D1 between the shafts of the rollers 8 was set and fixed so as to provide a spacing H2 of 10 µm (FIG. 17), whereby the entire region R1 was completely filled with the resin 5. By effecting the preliminary pressure step, all the air bubbles within the laminate 45 were completely discharged outside the laminate 45. Further, after the preliminary pressure step, the resin 5 preliminarily heated did not cause the capillary action, thus suppressing the generation of air bubbles.

In the above embodiments, if a large amount of the resin 5 is supplied, the shape of the supplied resin 5 does not become spherical and the resin 5 is spread by its own weight to contact the smooth plate 1 at a certain planar area, not a point (spot). As a result, a possibility that the air bubbles 21 are incorporated in the resin 5 is further increased. For this reason, the supplied resin 5 may preferably be appropriately divided into several spots in view of the amount of the resin 5 by dropping the resin 5 at several portions equally spaced.

In the case where a large amount of the resin 5 is not readily spread by its own weight, after supplying the resin 5 as shown in FIG. 18A, the wiring substrate 4 having thereon the resin 5 is turned upside down as shown in FIG. 18B to sharpen the shape of the resin 5, thus allowing a point contact with the smooth plate 1 to alleviate the air bubble generation.

In any case, almost all the air bubbles are removed in the preliminary pressure step, so that the number of the air bubbles is not necessarily made nothing before the preliminary pressure step. However, in order to further improve the production yield, the resin supplying conditions may preferably be set so as not to incorporate the air bubbles in the resin during the laminating step wherein the resin contacts the smooth plate. Further, in the above-described embodiments, although the resin 5 is supplied to the wiring substrate 4 as shown in FIGS. 16 and 18, the resin 5 may be placed dropwise on the smooth plate 1 and then the wiring substrate 4 may be superposed thereon so as to sandwich the resin 5.

Hereinbelow, the production process of an electrode plate according to a second aspect of the present invention will be described based on FIGS. 19–25.

First, a wiring substrate 4 comprising a glass substrate 4 (e.g., 300×340×1.1 mm) surface-polished on both sides and provided with a plurality of metal electrodes 3 (e.g., of aluminum) as shown in FIG. 19 is prepared through the steps shown in FIGS. 20A–20D.

Specifically, for example, a ca. 2 $\mu$m-thick aluminum layer 23 constituting metal electrodes 3 is formed on the entire upper surface of the glass substrate 2 b sputtering (FIG. 20A). On the aluminum layer 23, a ca. 2 $\mu$m-thick layer of a photoresist 24 is spin-coated and exposed to light via a photomask 5 having a pattern corresponding to that of the metal electrodes 3 to be formed, followed by development and post-baking to form an etching (resist) pattern 24' on the aluminum layer 23 (FIGS. 20B and 20C).

Then, the thus-treated substrate 2 is immersed in an etchant to etch a portion of the aluminum layer 23 not covered with the etching pattern 24', followed by removal of the etching pattern 24' to form the metal electrodes 3 of aluminum on the glass substrate 2. The metal electrodes 3, e.g., have a stripe-shaped pattern having a width of 20 $\mu$m and a pitch of 300 $\mu$m.

Thereafter, through steps shown in FIGS. 22A–22G, an electrode plate is produced.

On the glass substrate 2 having thereon the metal electrodes 3, a coupling-treating liquid (e.g., consisting of 1 wt. part of a silane coupling agent ("A-174", mfd. by Nippon Uniker K.K.) and 40 wt. parts of ethyl alcohol) is applied by spin coating, followed by heat treatment (e.g., at 100° C. for 20 min.) to effect adhesiveness-imparting treatment.

Figure 22A:
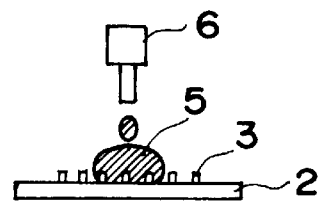
FIGS. 22A–22G are schematic sectional views for production steps for illustrating an embodiment of the process for producing an electrode plate according to a second aspect of the present invention.

On the coupling-treated surface of the substrate 2, a flowable resin 5 (e.g., UV-curable resin) was placed dropwise by using a dispenser 6 (FIG. 22A). Specifically, e.g., 800 mg (in total) of an acrylic UV-curable resin composition 5 consisting of pentaerythritol triacrylate/neopentyl glycol diacrylate/1-hydroxycyclohexyl phenyl ketone (=50/50/2 by weight) was placed dropwise by using the dispenser 6 (nozzle size=0.5 mm, ejection pressure=1 kg/cm$^2$, ejection time=1.2 sec. (for each spot), the number of spots=5). The thus supplied resin 5 is much larger than a minimum necessary amount for filling the entire gaps between the metal electrodes 3 but is generally necessary to discharge air bubbles incorporated in the UV-curable resin 5 in a later pressing step.

In this embodiment according to the second aspect of the present invention, the production apparatus includes positioning or locating members (means) 59a and 59b each disposed on an end side (periphery) of the glass substrate 2.

Herein, although the positioning member is described and illustrated to be separated into two portions 59a and 59b, e.g., as shown in FIGS. 22B–22G, the positioning member generally has a frame-like planar shape (when viewed from an upper region in FIGS. 22B–22G) and accordingly the description and illustration for the positioning member should be understood to be made for the purpose of simplification.

Figure 22B:
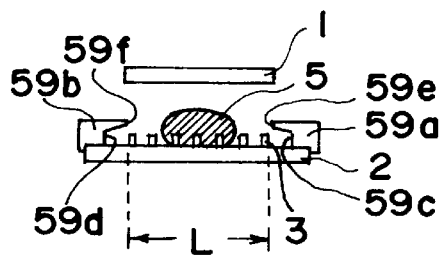

The positioning members 59a and 59b are used for positioning a smooth plate 1 for pressing the UV-curable resin 5 in a region L to be filled with the resin 5 (FIG. 22B).

Each positioning member 59a (59b) generally comprises a metallic material, such as SUS material, or a resinous material, such as fluorine-containing resin, and has a recess portion 59c (59d) for storing and blocking an excessive UV-curable resin portion flowing out from the region L (between the metal electrodes 3) and also has a tip portion 59e (59f) located over slightly outside the outermost metal electrode 3 and between which the smooth plate 1 is inserted and fixed.

Accordingly, the smooth plate 1 has a size (length in a longitudinal direction on the drawing) set to be slightly larger than the region L to be filled with the UV-curable resin 5 and smaller than that of the glass substrate 2.

In this embodiment, the smooth plate 1 comprises a blue plate glass surface-polished on both sides and has a size of 220 (width)×290 (length) mm in a thickness of 1.1 mm.

On the surface of the smooth plate 1 contacting the UV-curable resin 5, a release agent of fluorine or silicon-containing type may be preliminarily applied in order to enhance a releasability in the later pressing step.

Figure 22C:
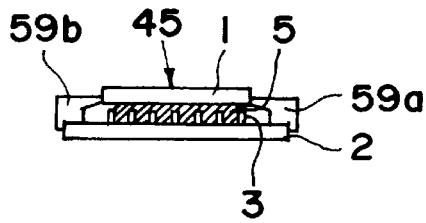

The smooth plate 1 is disposed between the tip portions 59e and 59f of the positioning members 59a and 59b so as to contact and sandwich the UV-curable resin 5 between the smooth plate 1 and the substrate 2 to prepare a laminate 45 (FIG. 22C).

The laminate 45 is heated, e.g., at 60° C. for 20 min. in an oven (not shown).

The heated laminate 45 is then conveyed in a direction of an arrow A by a conveying device (not shown) and sandwiched between a pair of rotatable rollers 51a and 51b of a roller press (as shown in FIGS. 12 and 13) to spread the UV-curable resin 5 under pressure application (FIGS. 22D, 22E, 22F and 22G).

Each roller 51a (51b), e.g., comprises a core metal (diameter=80 mm, width=600 mm) surface-coated with a 10 mm-thick silicone rubber member (width=220 mm, rubber hardness=60 degrees) (not shown), thus not breaking the glass substrate 2 and smooth plate 1 even when a contaminant such as dust is incorporated in a nip portion. The rollers 51a and 51b rotate, e.g., at a peripheral speed of 20 cm/min. and are supplied with a load of, e.g., 500 kgf in total at both end portions of rotation shafts (axes) 52a and 52b by an air cylinder (not shown). Further, each roller 51a (51b) is heated at, e.g., 60° C. by a heater contained therein and provided with a guide member (not shown) for positioning the silicone rubber member of the roller 51a (51b) at the smooth plate surface during the pressing step.

The production apparatus used in this embodiment includes two photoelectric sensors 53a and 53b for detecting a timing for pressure application and a timing for pressure release, respectively, and a controller 54 for controlling operations of pressure application and pressure release for the laminate 45 by the rollers 51a and 51b based on detection signals from the photoelectric sensors 53a and 53b.

A distance from the sensor 53a (53b) to the rollers 51a an 51b is set to be substantially equal to the length of the smooth plate (e.g., 290 mm in this embodiment).

The pressing operation by the rollers 51a and 51b of the roller press is controlled by the controller 54 based on detection and undetection signals (ON/OFF) for the laminate 45 by the sensors 53a and 53b.

Figure 22D:
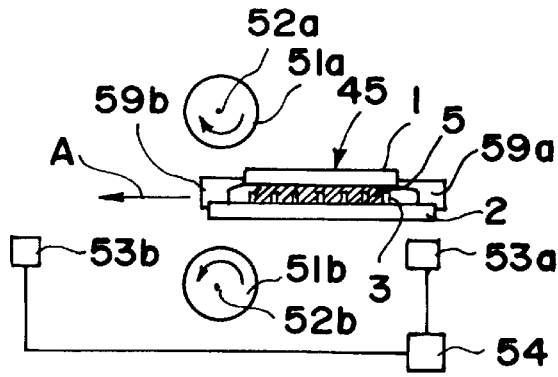

Specifically, as shown in FIG. 22D, when the photoelectric sensor 53a detects the laminate ("ON" state), i.e., the smooth plate 1 is conveyed toward the rollers 51a and 51b, the laminate 45 is not pressed by the rollers 51a and 51b.

Figure 22E:
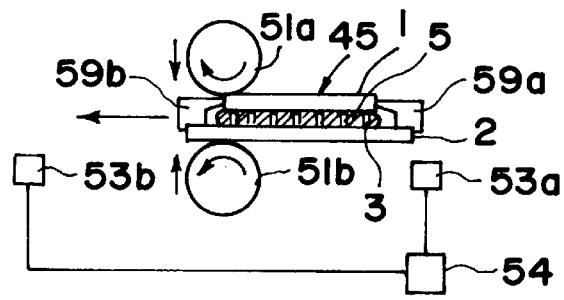
Figure 22F:
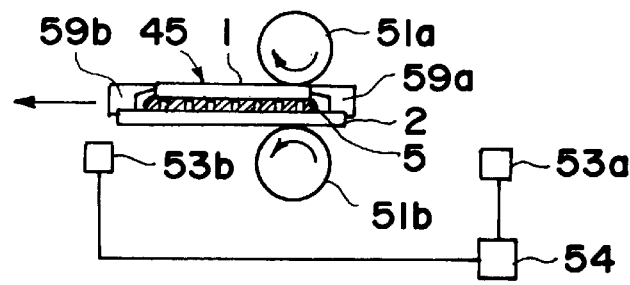
Figure 22G:
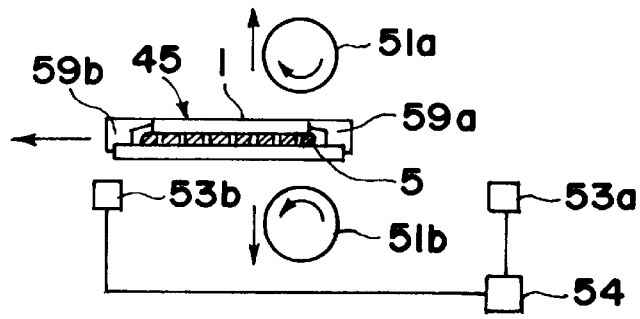

Then, as shown in FIG. 22E, when the rear end (right-hand side on the drawing) of the laminate 45 passes over the sensor 53a ("OFF" state), i.e., the forward end of the smooth plate 1 is conveyed to the nip portion between the rollers 51a and 51b, the rollers 51a and 51b are actuated to press the forward end of the smooth plate and the substrate 2 to each other. Thereafter, as shown in FIGS. 22F and 22G, when a forward end of the laminate 45 passes over the photoelectric sensor 53b ("OFF" state), i.e., the pressing of the laminate 45 by the rollers 51a and 51b is completed, the pressure exerted on the laminate 45 is released.

As described above, the pressed portion is moved from the forward end of the smooth plate 1 to the rear end thereof relative to the rollers 51a and 51b, i.e., a moving range (pressing range) of the pressed portion is set to be larger than the region L (shown in FIG. 22B) and smaller than the length of the glass substrate 2, whereby the metal electrodes 3 are uniformly embedded with the UV-curable resin 5.

By the above pressing operation, the resin 5 is removed from the metal electrode surface and completely fill the gaps between the metal electrodes 3 to provide a flat surface while firmly and uniformly pressing the smooth plate 1 and the substrate 2 to each other.

Figure 23:
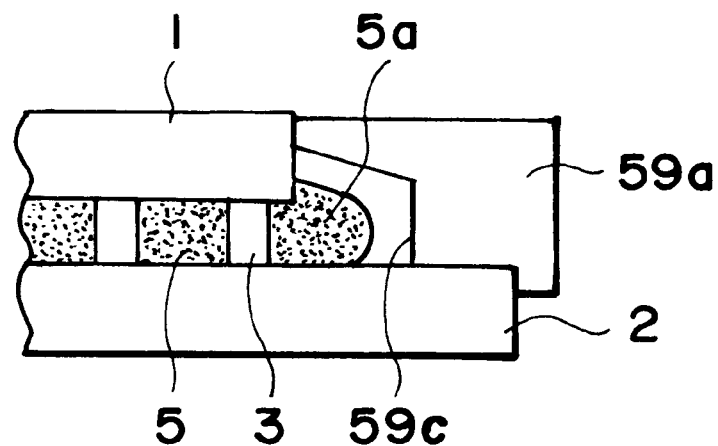
FIGS. 23 and 25 are respectively a schematic sectional view for illustrating an embodiment of a positioning means used in the production process of an electrode plate according to the second aspect of the present invention.

In the pressing step, an excessive resin portion 5a flowing out over the metal electrodes 3 is stored or stayed at the recess portion 59c (59d) of the positioning member 59a (59b) as shown in FIG. 23. The excessive resin portion 5a is not moved outside the laminate by its own surface tension and also does not contact the recess portion 59c (59d).

Figure 24A:
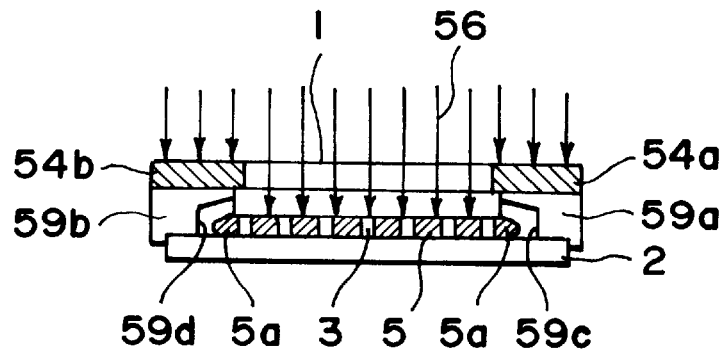

Then, after the positioning members 59a and 59b are covered with photomasks 55a and 55b so as not to expose the resin portion 5a in the recess portions 59c and 59d to UV rays, the UV curable resin 5 is cured, e.g., by irradiating it for 2 min. with UV rays 56 (peak wavelength=365 nm) issued from four 100 W high-pressure mercury lamps (not shown) from the smooth plate side (FIG. 24A).

Figure 24B:
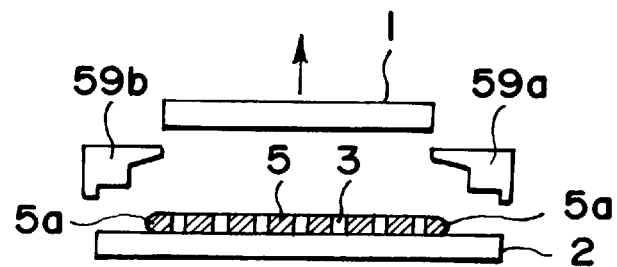

Thereafter, the positioning members 59a and 59b are removed from the laminate 45 and the smooth plate 1 is separated from the substrate 2 (FIG. 24B).

Figure 24C:
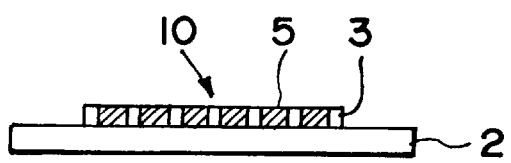

The substrate 2 having thereon the metal electrodes 3 buried flat with the cured resin 5 is, e.g., subjected to ultrasonic cleaning for 2 min. with isopropyl alcohol to remove the (uncured) excessive resin portions 5a outside the metal electrodes 3 to obtain an electrode plate 10 (FIG. 24C).

Figure 24D:
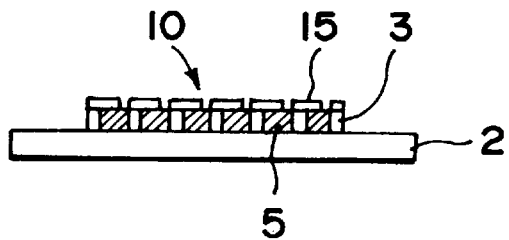

On the flat surface of the metal electrodes 3 and cured resin 5, a plurality of transparent electrodes 15 of, e.g., ITO films are formed, e.g., through the steps shown in FIGS. 21A–21E so that each transparent electrode 15 is electrically connected with an associated metal electrode 3 (FIG. 24D).

Figure 25:
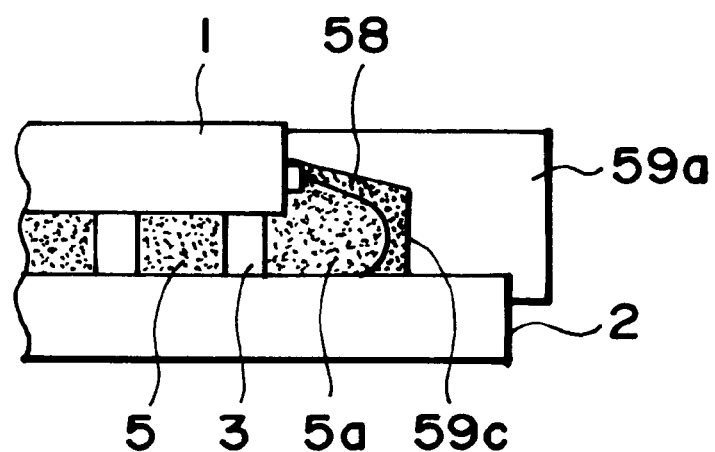

Further, as shown in FIG. 25, the recess portion 59c (59d) may be provided with a sponge absorbing member 58 in order to absorb the excessive resin portion 5a even when a large amount of the resin 5 flows out from the metal electrode forming region, thus preventing contamination or stain of the positioning member 59a (59b).

It is possible to determine whether the sponge absorbing member 58 is provided depending on an amount of the excessive resin portion 5a varying depending on a resin-supplying accuracy of the dispenser 6 and the resin amount necessary to remove air bubbles incorporated therein. Accordingly, when the resin-supply accuracy of the dispenser 6 used is low, the provision of the absorbing member 6 to the positioning member 59a (59b) is effective.

In the above-mentioned embodiment, it is possible to produce an electrode plate 10 with a good productivity without soiling the members of the production apparatus, such as the rollers 51a and 51b and the positioning members 59a and 59b by the excessive resin portion 5a.

Further, even in the case where air bubbles are incorporated in the UV-curable resin 5, by moving a portion containing air bubbles as the excessive resin portion 5a outside the metal electrodes 3 with a large amount of the supplied resin 5, it is possible to improve production yield of the resultant electrode plate 10 since the excessive resin portion 5a containing the air bubbles are stored at the recess portions 59c and 59d and removed as the uncured resin portion by washing (cleaning).

In the above embodiment for the second aspect of the present invention, although the pressed portion is moved in a direction perpendicular to the longitudinal (extension) direction of the metal electrodes 3 in the pressing steps as shown in FIGS. 22D–22G, the pressed portion may be moved along the metal electrode extension direction similarly as in the first to fourth embodiment (as to the first aspect of the present invention) as shown in FIGS. 10, 11 and 16D, thus effectively decreasing the air bubbles generated along the metal electrode extension direction particularly in the case of using a large amount of the UV-uncurable resin 5.

As described above, in the embodiment as to the second aspect of the present invention, it is possible to effectively prevent soiling of the members of the production apparatus even if the resin flows out from between the smooth plate an the substrate in the pressing step, thus not requiring an additional removal (wiping) step for removing the resin attached to the apparatus members. As a result, it becomes possible to produce the electrode plate and the liquid crystal device with good productivity.

The liquid crystal device produced by the process according to the first and second aspects of the present invention has an electrode structure wherein the transparent electrodes electrically connected with the underlying metal electrodes, thus suppressing voltage waveform deformation due to electrical signal delay particularly in the case of using a chiral smectic liquid crystal device and also being stably driven to improve display qualities.

What is claimed is:

1. A process for producing an electrode plate comprising a substrate, a plurality of stripe-shaped electrodes with gaps therebetween, and a flattening layer filling the gaps; said process comprising the steps of:

supplying a flowable polymeric material to a part of a surface of a smooth plate or substrate, applying the smooth plate and the substrate to each other so as to sandwich the polymeric material therebetween to provide a laminate, pressing the smooth plate and the substrate to each other, the pressing step including a preliminary pressure step wherein a pressed portion is moved from a first side of the laminate to a second side parallel to the first side under application of a first pressure and a main pressure step wherein a pressed portion is moved from one side of the laminate to the other side parallel to said one side under application of a second pressure which is larger than the first pressure to extend the polymeric material over at least a region including the stripe-shaped electrodes, curing the polymeric material by irradiation with a light to form a flattening layer, and removing the smooth plate from the laminate.

2. A process according to claim 1, wherein the pressed portion is moved in a direction along a longitudinal direction of the stripe-shaped electrodes in at least one of the preliminary pressure step and the main pressure step.

3. A process according to claim 1, wherein the polymeric material is heated in the main pressure step to provide a viscosity lower than a viscosity at room temperature.

4. A process according to claim 1, wherein the polymeric material is kept in a cooling state in the preliminary pressure step to provide an increased viscosity.

5. A process according to claim 1, wherein, in the preliminary pressure step, the pressed portion is moved at a speed faster than a speed in the main pressure step.

6. A process according to claim 1, wherein the preliminary pressure step is performed by using a preliminary pressure means including a pair of oppositely disposed pressing members provided with a prescribed spacing therebetween so as to uniformly press the smooth plate and the substrate.

7. A process according to claim 1, wherein the polymeric material is used in an amount which is 10–50 times as large as an amount required to fill entire gaps between the stripe-shaped electrodes.

8. A process according to claim 1, wherein the smooth plate has a size larger than that of a region to be filled with the polymeric material and smaller than that of the substrate, and the pressure application is performed in a region having a size larger than that of the region to be filled with the polymeric material and smaller than that of the substrate.

9. A process for producing a liquid crystal device in which a liquid crystal is disposed between a pair of plates including at least one electrode plate comprising:

a substrate, a plurality of stripe-shaped electrodes with gaps therebetween, and a flattening layer filling the gaps; said process comprising the steps of:

supplying a flowable polymeric material to a part of a surface of a smooth plate or substrate, applying the smooth plate and the substrate to each other so as to sandwich the polymeric material therebetween to provide a laminate, pressing the smooth plate and the substrate to each other, the pressing step including a preliminary pressure step wherein a pressed portion is moved from a first side of the laminate to a second side parallel to the first side under application of a first pressure and a main pressure step wherein a pressed portion is moved from one side of the laminate to the other side parallel to said one side under application of a second pressure which is larger than the first pressure to extend the polymeric material over at least a region including the stripe-shaped electrodes, curing the polymeric material by irradiation with a light to form a flattening layer, and removing the smooth plate from the laminate, forming a plurality of principal electrodes on the flattening layer and stripe-shaped electrodes, oppositely disposing the pair of plates including at least one electrode plate provided with the principal electrodes formed on the flattening layer and stripe-shaped electrodes so as to leave a gap between the plates, and filling the gap with the liquid crystal.

10. A process according to claim 9, wherein the pressed portion is moved in a direction along a longitudinal direction of the stripe-shaped electrodes in at least one of the preliminary pressure step and the main pressure step.

11. A process according to claim 9, wherein the polymeric material is heated in the main pressure step to provide a viscosity lower than a viscosity at room temperature.

12. A process according to claim 9, wherein the polymeric material is kept in a cooling state in the preliminary pressure step to provide an increased viscosity.

13. A process according to claim 9, wherein, in the preliminary pressure step, the pressed portion is moved at a speed faster than a speed in the main pressure step.

14. A process according to claim 9, wherein the preliminary pressure step is performed by using a preliminary pressure means including a pair of oppositely disposed pressing members provided with a prescribed spacing therebetween so as to uniformly press the smooth plate and the substrate.

15. A process according to claim 9, wherein the polymeric material is used in an amount which is 10–50 times as large as an amount required to fill entire gaps between the stripe-shaped electrodes.

16. A process according to claim 9, wherein the smooth plate has a size larger than that of a region to be filled with the polymeric material and smaller than that of the substrate, and the pressure application is performed in a region having a size larger than that of the region to be filled with the polymeric material and smaller than that of the substrate.

17. A process according to claim 9, wherein the liquid crystal comprises a chiral smectic liquid crystal.

18. A process according to claim 9 wherein said at least one electrode plate further comprises an alignment control film formed on the principal electrodes.

19. A process for producing an electrode plate comprising the steps of:

forming on a substrate a plurality of electrodes with gaps therebetween in a prescribed pattern, placing a flowable resin between the substrate and a smooth plate, pressing a laminate including the substrate and the smooth plate to each other so as to ensure an intimate contact between the smooth plate and the electrodes formed on the substrate while extending the flowable resin, curing the flowable resin, removing the smooth plate from the substrate having thereon the cured resin to prepare an electrode plate comprising the substrate provided with the electrodes embedded flatly with the cured resin disposed at the gaps of the electrodes, wherein the smooth plate has a size larger than that of a region to be filled with the resin and smaller than that of the substrate, and the pressing is performed in a region having a size larger than that of the region to be filled with the resin and smaller than that of the substrate.

20. A process according to claim 19, wherein the smooth plate is positioned so as to correspond to the region to be filled with the resin.

21. A process according to claim 19, wherein the pressing is performed so that a pressed portion contacting the laminate is moved from one side of the laminate to the other side of the laminate while pressing an upper surface and a lower surface of the laminate with a pair of rotatable rollers, respectively.

22. A process according to claim 19, wherein the pressing is performed by conveying the laminate to the pressed portion and controlling a timing for pressure application and a timing for pressure release so as to press only an entire region to be filled with the resin.

23. A process according to claim 19, wherein the substrate is provided with a member having a recess portion at its end portion so as to block an excessive flowable resin flowing out from the region to be filled with the resin at the recess portion.

24. A process according to claim 19, wherein the curing of the flowable resin is performed only at the region to be filled with the resin.

25. A process according to claim 19, wherein the flowable resin comprises a ultraviolet-curable resin.

26. A process according to claim 25, wherein the ultraviolet-curable resin is cured by irradiating the resin with ultraviolet rays from the outside of the smooth plate.

27. A process according to claim 25, wherein the substrate comprises a light-transmissive substrate and the ultraviolet-curable resin is cured by irradiating the resin with ultraviolet rays from the outside of the light-transmissive substrate.

28. An apparatus for producing an electrode plate, including:

a smooth plate, a substrate provided with a plurality of electrodes with gaps therebetween to be filled with a flowable resin, means for placing dropwise the flowable resin at a prescribed position of the substrate, means for pressing a laminate including the smooth plate and the substrate between which the flowable resin is sandwiched so that the flowable resin extends over a region to be filled with the resin to ensure an intimate contact between the smooth plate and the electrodes provided to the substrate, means for curing the flowable resin, and means for positioning the smooth plate so as to correspond to the region to be filled with the resin;

wherein the smooth plate has a size larger than that of a region to be filled with the resin and smaller than that of the substrate, and the pressing is performed in a region having a size larger than that of the region to be filled with the resin and smaller than that of the substrate, and the smooth plate is removed from the substrate having thereon the resin to prepare an electrode plate comprising the substrate provided with the electrodes embedded flatly with the cured resin disposed at the gaps of the electrodes.

29. An apparatus according to claim 28, wherein the pressing means performs a pressing operation so that a pressed portion contacting the laminate is moved from one side of the laminate to the other side of the laminate while pressing an upper surface and a lower surface of the laminate with a pair of rotatable rollers, respectively.

30. An apparatus according to claim 28, further including means for detecting a timing for pressure application and a timing for pressure release by the pressing means so as to correspond to only an entire region to be filled with the resin, and means for controlling operations of the pressure application and pressure release based on detection signals from the detection means.

31. An apparatus according to claim 28, wherein the positioning means is provided with a recess portion so as to block an excessive flowable resin flowing out from the region to be filled with the resin at the recess portion.

32. An apparatus according to claim 28, herein the curing means performs the curing of the flowable resin only at the region to be filled with the resin.

33. An apparatus according to claim 28, wherein the flowable resin comprises a ultraviolet-curable resin.

34. An apparatus according to claim 33, wherein the curing means performs the curing of the ultraviolet-curable resin by irradiating the resin with ultraviolet rays from the outside of the smooth plate.

35. An apparatus according to claim 33, wherein the substrate comprises a light-transmissive substrate and the curing means performs the curing of the ultraviolet-curable resin by irradiating the resin with ultraviolet rays from the outside of the light-transmissive substrate.

36. A process for producing a liquid crystal device in which a liquid crystal is disposed between a pair of oppositely disposed plates including at least one electrode plate; said process comprising the steps of:

forming on a substrate a plurality of electrodes with gaps therebetween in a prescribed pattern, placing a flowable resin between the substrate and a smooth plate, pressing a laminate including the substrate and the smooth plate to each other so as to ensure an intimate contact between the smooth plate and the electrodes formed on the substrate while extending the flowable resin, curing the flowable resin, removing the smooth plate from the substrate having thereon the cured resin to prepare an electrode plate comprising the substrate provided with the electrodes embedded flatly with the cured resin disposed at the gaps of the electrodes, forming a plurality of principal electrodes on the cured resin and electrodes, oppositely disposing the pair of plates including at least one electrode plate provided with the principal electrodes formed on the flattening layer and electrodes so as to leave a gap between the plates, and filling the gap with the liquid crystal, wherein the smooth plate has a size larger than that of a region to be filled with the resin and smaller than that of the substrate, and the pressing is performed in a region having a size larger than that of the region to be filled with the resin and smaller than that of the substrate.

37. A process according to claim 36, wherein the smooth plate is positioned so as to correspond to the region to be filled with the resin.

38. A process according to claim 36, wherein the pressing is performed so that a pressed portion contacting the laminate is moved from one side of the laminate to the other side of the laminate while pressing an upper surface and a lower surface of the laminate with a pair of rotatable rollers, respectively.

39. A process according to claim 36, wherein the pressing is performed by conveying the laminate to the pressed portion and controlling a timing for pressure application and a timing for pressure release so as to press only an entire region to be filled with the resin.

40. A process according to claim 36, wherein the substrate is provided with a member having a recess portion at its both end portions so as to block an excessive flowable resin flowing out from the region to be filled with the resin at the recess portion.

41. A process according to claim 36, herein the curing of the flowable resin is performed only at the region to be filled with the resin.

42. A process according to claim 36, wherein the flowable resin comprises a ultraviolet-curable resin.

43. A process according to claim 42, wherein the ultraviolet-curable resin is cured by irradiating the resin with ultraviolet rays from the outside of the smooth plate.

44. A process according to claim 42, wherein the substrate comprises a light-transmissive substrate and the ultraviolet-curable resin is cured by irradiating the resin with ultraviolet rays from the outside of the light-transmissive substrate.

45. A process according to claim 36, wherein the principal electrodes comprises transparent electrodes each electrically connected with at least a part of an associated electrode formed on the substrate.

46. A process according to claim 36, wherein the liquid crystal comprises a chiral smectic liquid crystal.

* * * * *

UNITED STATES PATENT AND TRADEMARK OFFICE
CERTIFICATE OF CORRECTION

PATENT NO. : 5,909,266

DATED : June 1, 1999

INVENTOR(S) : YUJI MATSUO ET AL

Page 1 of 5

It is certified that error appears in the above-identified patent and that said Letters Patent is hereby corrected as shown below:

ON THE TITLE PAGE

[56] References cited, under FOREIGN PATENT DOCUMENTS:
"02063019" should read --2-63019--; and
"06347810" should read --6-347810--.

COLUMN 1

Line 12, "steps." should read --step.--.

COLUMN 2

Line 42, "shows" should read --show--; and
Line 55, "16b" should read --106b--.

COLUMN 3

Line 38, "is" should read --are--.

UNITED STATES PATENT AND TRADEMARK OFFICE
CERTIFICATE OF CORRECTION

PATENT NO. : 5,909,266

DATED : June 1, 1999

INVENTOR(S) : YUJI MATSUO ET AL

It is certified that error appears in the above-identified patent and that said Letters Patent is hereby corrected as shown below:

COLUMN 4

Line 40, "resent" should read --present--.

COLUMN 7

Line 30, "a" should be deleted.

COLUMN 8

Line 12, "trodes" should read --trode--.

COLUMN 9

Line 51, "irradiate" should read --irradiated--.

COLUMN 10

Line 17, "201a an" should read --201a and--.

UNITED STATES PATENT AND TRADEMARK OFFICE
CERTIFICATE OF CORRECTION

PATENT NO. : 5,909,266

DATED : June 1, 1999

INVENTOR(S) : YUJI MATSUO ET AL

It is certified that error appears in the above-identified patent and that said Letters Patent is hereby corrected as shown below:

COLUMN 11

Line 55, "52 portion" should read --S2 portion--; and
   Line 66, "solve" should read --solves--.

COLUMN 12

Line 12, "cal. 50" should read --ca. 50--.

COLUMN 15

Line 27, "be" should be deleted.

COLUMN 18

Line 45, "an" should read --and--.

UNITED STATES PATENT AND TRADEMARK OFFICE
CERTIFICATE OF CORRECTION

PATENT NO. : 5,909,266

DATED : June 1, 1999

INVENTOR(S) : YUJI MATSUO ET AL

It is certified that error appears in the above-identified patent and that said Letters Patent is hereby corrected as shown below:

COLUMN 19

Line 67, "are" should read --is--.

COLUMN 20

Line 17, "an" should read --and--.

COLUMN 22

Line 13, "claim 9" should read --claim 9,--;
Line 26, "resin," should read --resin, and--; and
Line 62, "a" should read --an--.

UNITED STATES PATENT AND TRADEMARK OFFICE
CERTIFICATE OF CORRECTION

PATENT NO. : 5,909,266

DATED : June 1, 1999

INVENTOR(S) : YUJI MATSUO ET AL

It is certified that error appears in the above-identified patent and that said Letters Patent is hereby corrected as shown below:

<u>COLUMN 23</u>

Line 18, "resin;" should read --resin,--;
Line 47, "herein" should read --wherein--; and
Line 51, "a" should read --an--.

<u>COLUMN 24</u>

Line 47, "herein" should read --wherein--;
Line 51, "a" should read --an--; and
Line 60, "comprises" should read --comprise--.

Signed and Sealed this

Twenty-fifth Day of April, 2000

Attest:

Q. TODD DICKINSON

*Attesting Officer*   *Director of Patents and Trademarks*